(12) United States Patent
Schechter et al.

(10) Patent No.: US 8,599,012 B2
(45) Date of Patent: Dec. 3, 2013

(54) REMOTE MONITORING SYSTEM

(75) Inventors: Harry J. Schechter, Needham, MA (US); Kevin Felichko, Thurmont, MD (US)

(73) Assignee: Schechter Tech, LLC, Boston, MA (US)

( * ) Notice: Subject to any disclaimer, the term of this patent is extended or adjusted under 35 U.S.C. 154(b) by 0 days.

(21) Appl. No.: 13/554,877

(22) Filed: Jul. 20, 2012

(65) Prior Publication Data

US 2012/0286969 A1 Nov. 15, 2012

Related U.S. Application Data

(63) Continuation of application No. 12/275,971, filed on Nov. 21, 2008, now Pat. No. 8,248,252.

(51) Int. Cl.
*G08B 1/08* (2006.01)

(52) U.S. Cl.
USPC .............. 340/539.26; 340/539.1; 340/870.02; 340/501

(58) Field of Classification Search
None
See application file for complete search history.

(56) References Cited

U.S. PATENT DOCUMENTS

| | | | |
|---|---|---|---|
| 5,892,441 A | 4/1999 | Woolley et al. | |
| 6,112,246 A | 8/2000 | Horbal et al. | |
| 6,509,830 B1 | 1/2003 | Elliott | |
| 6,553,336 B1 | 4/2003 | Johnson et al. | |
| 6,646,564 B1 | 11/2003 | Azieres et al. | |
| 6,741,174 B2 * | 5/2004 | Rhoades et al. | 340/540 |
| 6,817,757 B1 * | 11/2004 | Wallace | 340/870.17 |
| 7,026,929 B1 | 4/2006 | Wallace | |
| 7,191,097 B1 | 3/2007 | Lee et al. | |
| 7,342,504 B2 | 3/2008 | Crane et al. | |
| 7,456,736 B2 | 11/2008 | Primm et al. | |
| 7,483,805 B2 | 1/2009 | Sparks et al. | |
| 7,688,952 B2 | 3/2010 | Light et al. | |
| 7,822,387 B2 | 10/2010 | Gross | |
| 7,902,975 B2 | 3/2011 | Glenn et al. | |
| 7,952,485 B2 | 5/2011 | Schechter et al. | |
| 8,181,113 B2 * | 5/2012 | Abbott et al. | 715/744 |
| 8,228,183 B2 * | 7/2012 | Glenn et al. | 340/531 |
| 2006/0028335 A1 | 2/2006 | Glenn et al. | |

(Continued)

OTHER PUBLICATIONS

Abbasi et al., "A survey on clustering algorithms for wireless sensor networks," Computer Communications 30, published 2007, pp. 2826-2841.

(Continued)

*Primary Examiner* — Eric M Blount
(74) *Attorney, Agent, or Firm* — Wolf, Greenfield & Sacks, P.C.

(57) ABSTRACT

A temperature monitoring service in which remote monitoring units are distributed to customers who then set up monitoring as desired at their facilities. The devices may be registered through a web site using the Internet. Monitoring information may be communicated using a publicly available, wireless network, such as a cellular telephone network. The service may be provided with a system, including a server, which can deliver high levels of monitoring functionality. The server may support streaming monitoring information to a customer for analysis or sending a command activating a device connected to a remote unit. Remote units associated with the same location may be in a pool, comprising one active unit and one or more spare units, in which the server automatically identifies the active unit. The server may support analyzing monitoring information according to an expected cycle pattern of a ventilation system at the monitored facility.

29 Claims, 16 Drawing Sheets

(56) References Cited

U.S. PATENT DOCUMENTS

| | | | |
|---|---|---|---|
| 2006/0271695 A1 | 11/2006 | Lavian | |
| 2008/0052044 A1 | 2/2008 | Shoenfeld | |
| 2008/0155064 A1* | 6/2008 | Kosuge et al. | 709/219 |
| 2008/0176539 A1* | 7/2008 | Staton et al. | 455/414.1 |
| 2008/0186166 A1* | 8/2008 | Zhou et al. | 340/539.13 |
| 2010/0312881 A1* | 12/2010 | Davis et al. | 709/224 |

OTHER PUBLICATIONS

Cryolog, Traceo product literature, http://www.cryolog.com/en/pages/products_and_services/traceo/index.php, p. 1, 2007, downloaded Oct. 23, 2008.

EasyLog USB Data Logger product literature, http://www.lascarelectronics.com/temperaturedatalogger.php?datalogger=102, p. 1, downloaded Oct. 23, 2008.

iButtonLink Temperature Monitor product literature, http://www.ibuttonlink.com/1-wire-interface-masters.aspx, pp. 1-2, downloaded Oct. 23, 2008.

IT Watchdogs WeatherDuck product literature, http://www.itwatchdogs.com/duckdetails.shtml, p. 1, 2002-2005, downloaded Oct. 23, 2008.

Savvides et al., "The Bits and Flops of the N-hop Multilateration Primitive For Node Localization Problems," WSNA'02, Sep. 28, 2002, Atlanta, Georgia.

Sugano et al., "Indoor Localization System Using RSSI Measurement of Wireless Sensor network Based on Zigbee Standard", Wireless and Optical Communications, 2006, pp. 1-6.

THUM—Temperature Humidity USB Monitor product literature, Practical Design Group, LLC, http://practsol.com/thum.htm, pp. 1-2, 2004-2008, downloaded Oct. 23, 2008.

USB Tenki: USB Temperature sensors and more product literature, http://www.raphnet.net/electronique/usbtenki/index_en.php, pp. 1-8, 2002-2008, downloaded Oct. 23, 2008.

Younis et al., "Distributed Clustering in Ad-hoc Sensor Networks: A Hybrid, Energy-Efficient Approach," In Proceedings of IEEE INFOCOM, vol. 1, pp. 629-640, Mar. 2004.

Zanca et al., "Experimental comparison of RSSI-based localization algorithms for indoor wireless sensor networks," REALWSN'08, Apr. 1, 2008, Glasgow, United Kingdom.

Zhao et al., "Wireless Sensor Networks, An Information Processing Approach," Morgan Kaufmann Publishers, 2004, pp. 117-131.

"ZigBee—Wikipedia, the free encyclopedia," available at http:/en.wikipedia.org/wiki/Zigbee, retrieved Dec. 23, 2011.

* cited by examiner

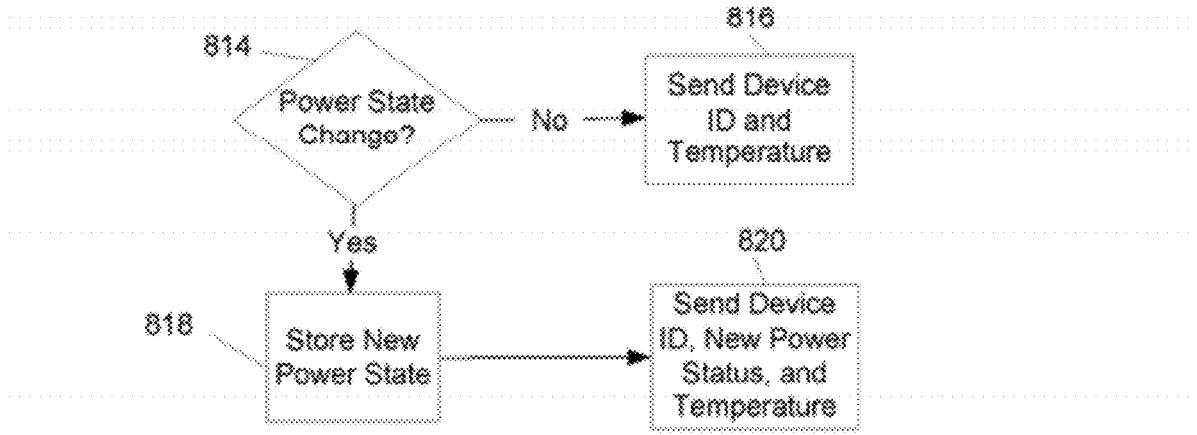
FIG. 8B
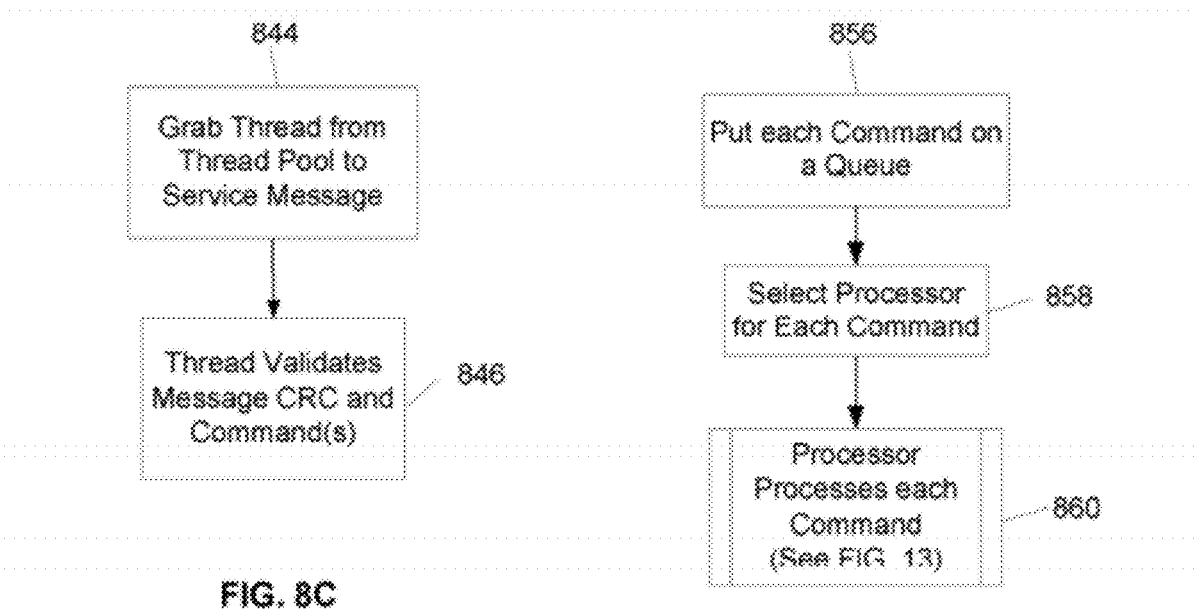
FIG. 8C
FIG. 8D

The remote device can send:

| Command | Length | Description |
|---|---|---|
| u | 1 | device has just powered on and firmware ver |
| t | 2 | temperature reading |
| p | 1 | power change (battery or AC) |

The server can send:

| Command | Length | Description |
|---|---|---|
| i | 1 | new report interval |

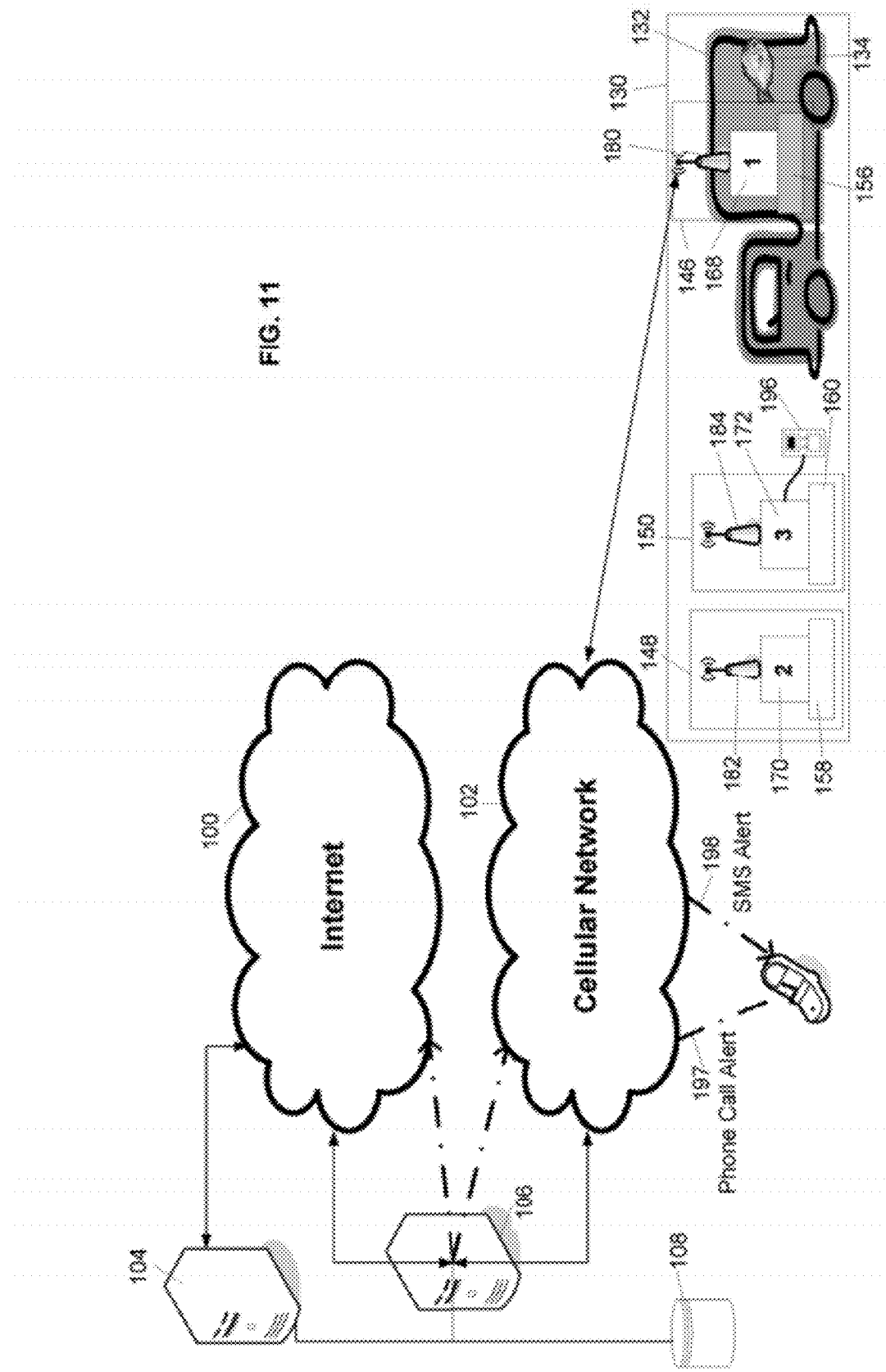

REMOTE MONITORING SYSTEM

RELATED APPLICATIONS

This application is a continuation of and claims the benefit under 35 U.S.C. §120 of U.S. patent application Ser. No. 12/275,971, which was filed in the U.S. Patent and Trademark Office on Nov. 21, 2008, and which is herein incorporated by reference in its entirety.

BACKGROUND

Temperature monitoring is used in many industries. For example, restaurants and food processing companies that rely on refrigeration equipment to keep their products fresh frequently use temperature monitoring. If a malfunction of the refrigeration equipment is not detected promptly, food could and gets either too hot or too cold, resulting in damage to the food products. For a business that relies on food, such damage could result in a large monetary loss and potentially a serious business disruption.

As another example, companies that operate servers or other computer equipment may also monitor temperature of their equipment. Sometimes, a malfunctioning component of the computer equipment will generate excessive heat. Thus, a temperature increase may indicate a defect that may need to be corrected. Also, excessive heat generated by the equipment may cause components to fail because they are operating beyond their proper operating temperature.

Temperature monitoring systems are known. These systems incorporate temperature sensors attached to or mounted near equipment for which temperature is to be monitored. The system responds if the temperature sensor indicates a temperature outside of a normal operating range. One type of response that has been used is to raise an alarm at facility where the monitored equipment is located. Some systems use bells, flashing lights or other forms of audible or visible indications of an improper operating temperature.

SchecterTech, LLC, doing business as Temperature@lert, the assignee of this application for patent, has developed a system for monitoring computer equipment that does not require that someone be physically present in the facility where malfunctioning equipment is located in order to receive an alarm. The Temperature@lert system uses remote units that combine a temperature sensor and a USB network interface. The remote unit can be readily attached to a computer device for which temperature is to be monitored. A small software agent installed on the computer can receive temperature readings over the USB interface and, if the sensor indicates a temperature out of range, can connect to an SMTP server to send an e-mail alerting a designated party to an improper operating temperature.

SUMMARY

The inventors have recognized and appreciated the desirability of an improved temperature monitoring system.

Such a system may perform a method of remote monitoring using a plurality of remote units, in which each remote unit comprises a sensor and a transceiver. The method comprises receiving through a web site a registration of a pool comprising at least a portion of the plurality of remote units. The registration of the pool comprises an indication of each remote unit of the portion of the plurality of remote units. The method also comprises monitoring a monitored location, associating reports received from the portion of the plurality of remote units with the monitored location.

In some embodiments, such a system may perform a method of remotely monitoring temperature using at least one remote unit comprising a temperature sensor and a transceiver. The method comprises registering the remote unit with a server over a first network. The method also comprises sending from the remote unit to the server a plurality of temperature reports over a second network, in which each temperature report comprises an indication of the output of the temperature sensor at a time associated with the report. The method also comprises obtaining information from the server over the first network.

Yet other embodiments may include a method of remotely monitoring temperature using at least one remote unit comprising a temperature sensor and a transceiver. The method comprises registering the remote unit with a server over a first network and sending from the remote unit to the server a plurality of temperature reports over a second network. Each temperature report comprises an indication of the output of the temperature sensor at a time associated with the report. The method also comprises obtaining information from the server over the second network.

Yet other embodiments include a method of remotely monitoring temperature using at least one remote unit comprising a temperature sensor and a transceiver. The method comprises receiving from the remote unit a plurality of temperature reports, in which each temperature report comprises an indication of the output of the temperature sensor at a time associated with the report. The method also comprises analyzing the temperature reports to detect a cyclical pattern associated with the temperature and generating an alarm when a subsequent temperature report indicates a temperature out of a range. More specifically, when a cyclical pattern is detected, the method involves subsequently comparing temperature reports of the plurality of temperature reports to the cyclical pattern and, when the comparison indicates a temperature that deviates from the cyclical pattern by more than a threshold amount the method provides for generating the alarm.

The foregoing is a non-limiting summary of the invention, which is defined by the attached claims.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 7 is a flowchart of a method of interaction between a remote monitoring device and a central server by which the remote monitoring device provides a monitoring report to the central server, beginning at the point in which the remote monitoring device powers on;

FIGS. 8B, 8C and 8D are flowcharts illustrating subprocesses performed in the process illustrated in FIG. 8A;

FIG. 11 is a sketch of portions of the system of FIG. 1 including a remote location at which pooled devices are used;

DETAILED DESCRIPTION

Figure 1:
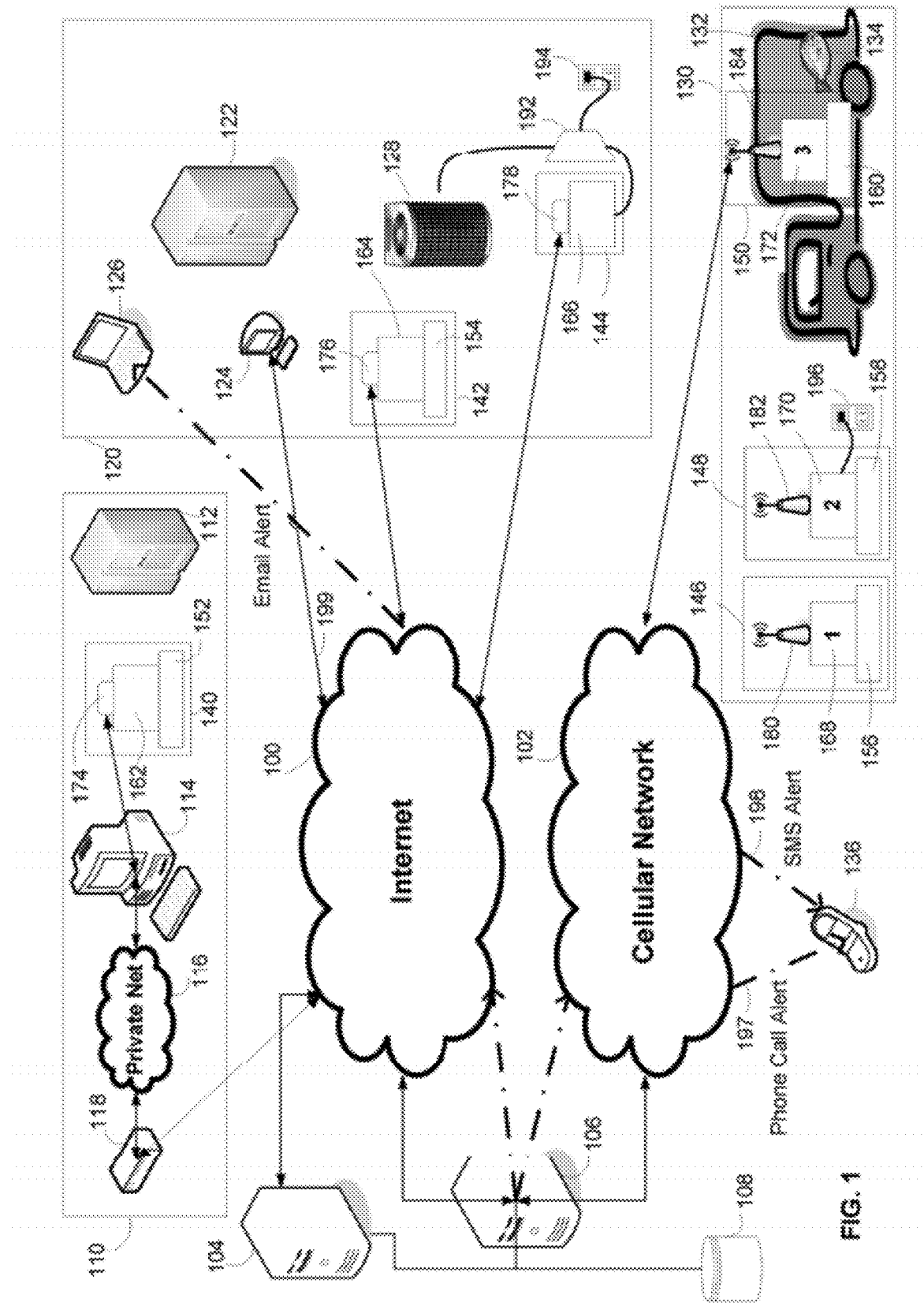
FIG. 1 is a sketch of a temperature monitoring system according to some embodiments of the invention.

A temperature monitoring system according to some embodiments of the invention has an architecture that allows operation even with low cost and easy to install remote units. Yet, the system is capable of providing a high level of monitoring functionality and data analysis through the use of a central server. Low cost operation may be further facilitated through the use of a protocol that provides low cost communication between the central server and remote units.

In some embodiments, the remote units and a central server communicate using a public, cellular network. Using a public, wireless network avoids the need for special wiring or connections between the remote units and the central server, and allows the remote units to be easily installed, even by a user. Such a network also allows the remote units to be installed on mobile platforms, such as refrigerated trucks.

To enable the server to interact with remote units, even if the remote units are user installed, the server may provide a web site or other suitable interface for users to register remote units. In some embodiments, remote units are distributed with indicia of an identifier for the device. When a user installs a device, the user may register the device to provide the server with the identifier for the device and monitoring parameters associated with the device.

To provide low cost remote units, the remote units may be designed to perform only a small number of functions. In some embodiments, each remote unit has a timer that can be controlled to trigger the remote unit to collect and transmit a temperature reading to the central server. The remote unit may transmit the temperature measurement and the associated identifier to the server and receive in response an indication of a value with which to set the timer to trigger the next measurement and reporting interval. In between reporting intervals, the remote unit may be placed in a low power, sleep state.

Despite the low cost and complexity of each remote unit, advanced functionality may be provided by the overall system. The server, for example, may apply one or more criteria to be able to ascertain, based on simple temperature reports, whether an alarm should be generated based on the temperature at the location of a remote unit. The server can then handle all communications associated with generating the alarm, which may be customized for each remote unit based on information provided in connection with the registration of the remote unit. As another example, the system may support pooling of devices, such that multiple remote units are associated with the same monitoring location. Such pooling may be useful, for example, in a mobile monitoring application in which the remote units operate on battery power. A second pooled remote unit may be substituted for a first remote unit while the first unit is connected to AC power for recharging. The system may be configured to recognize such a change of remote unit utilization and automatically adjust its temperature monitoring operations.

The criteria applied at the server to identify a condition may include an absolute temperature range, a maximum rate of change of temperature or deviation, by more than some threshold amount, from a cyclical pattern of temperature variations. Specific values for these criteria may be obtained in one or more suitable ways. For example, the alarm criteria may be based on parameters provided in connection with the registration of a remote unit or may be derived adaptively by the server as it processes temperature reports.

In addition to or instead of sending an alarm message to a user via a mechanism such as an e-mail, a text message or a voice call, the server may respond to an alarm condition by sending a command to an actuator that may modify the operation of equipment being monitored. For example, in response to detecting an over temperature condition for a piece of computer equipment, the server can send a command to an actuator coupled to a power switch to the equipment. In response to such a command, the actuator may open the switch to disconnect power to the equipment. The system architecture supports low cost actuator devices, which may have a simple controller and transceiver like a remote monitoring unit. The controller for the actuator may, when a command packet is sent to the actuator, trigger operation of the actuator. As with communications between the server and the remote monitoring units, in some embodiments, a command to the actuator may be formatted as a UDP packet communicated over a GSM network.

The server also may provide information in other formats. Instead of or in addition to sending alerts to a human user, the server may also make information available through a web site or similar interface. In some scenarios, information accessed through such an interface may be used to present a display to a user on demand by the user, or may be automatically pulled to a computing device programmed to analyze and take action based on temperature monitoring data.

In some embodiments, the system uses a cellular telephone network, such as a GSM network, for communication. Though a cellular network provides widespread network access that can be exploited with no special infrastructure, use of a cellular network for data communication can sometimes be expensive, particularly if a large amount of data or a large number of interactions between a remote location and a central location are required. However, in some embodiments, the overall communication cost can be low by employing a communication protocol that allows monitoring functionality to be implemented with low communication overhead. As a result, only a small amount of data is communicated using a relatively small number of interactions. As an example, each remote unit may send a UDP packet to communicate a temperature report or a status change for the device. The server may acknowledge the packet and provide a new monitoring interval for the remote unit with a second packet. In instances when the server cannot process the packet, it may provide a negative acknowledgement. Therefore, with just two packets exchanged, the remote unit can, in most instances, communicate a temperature measurement or status change.

In some embodiments, the server processing the packets containing temperature data is configured to efficiently and reliably process the packets with a low packet drop rate. The server may reliably process packets at a high speed even though the underlying protocol, such as UDP, may itself be unreliable.

Nonetheless, the system is fault tolerant. Because the remote unit receives a response from the server if its packet reaches the server, the remote unit can identify scenarios in which a packet did not reach the server and retransmit the packet. Similarly, because the server sets the reporting interval for each device, it can ascertain when a remote unit is not generating reports, and generate an alarm as appropriate.

FIG. 1 illustrates an example architecture of a temperature monitoring system according to some embodiments of the invention, as well as several environments in which it can be applied. The temperature monitoring system includes a portion at one or more central locations which communicates with devices at one or more remote locations at which monitoring data is collected and sent to the central location. Here, the monitored data relates to temperature data gathered from devices with temperature sensors at the remote locations, but other types of data may be gathered, either instead of or in addition to temperature sensor data. Remote locations may be fixed locations, such as restaurants or computer data centers, or mobile locations, such as a mobile food truck. Computing devices at the central and remote locations may communicate with one another over one or more wired or wireless communications media.

In the embodiment of FIG. 1, one central location is shown for simplicity, though data from remote devices may be received at a number of central locations. In this example, the central location includes a temperature monitoring server 106 that can be connected to one or more communication networks, such as Internet 100 and a cellular network 102. The temperature monitoring server 106 may be implemented by one server computing device or by a number of server computing devices operating as a unified system. Temperature monitoring server 106 may receive data, such as temperature sensor data, from devices at remote locations, efficiently process the data, and take various actions if the data does not conform to certain criteria. For example, if the temperature rises beyond a specified threshold, temperature monitoring server 106 may alert a customer or send a remote command to activate a back-up air-conditioning or refrigeration or heating unit.

Temperature monitoring server 106 may store the data in a computer storage medium, such as database 108. Database 108 may be on the same computing device as temperature monitoring server 106, or it may be on one or more separate computing devices loaded with database software, such as MySQL, and may be connected to the temperature monitoring server 106 over a communication link. Data that may be stored includes historical data gathered from remote devices, as well as the historical results of processing that data. Additionally, data may be stored to be used in processing monitoring reports, such as data to indicate permissible temperature limits associated with monitoring devices, or actions to be taken in response to a monitoring report that is outside of a specified range.

One or more mechanisms may be provided to add, delete or otherwise manipulate data in database 108. Likewise, one or more mechanisms may be provided to access the data. For example, temperature monitoring server 106 may allow users of the remote devices to access the stored data in various forms and through a variety of interfaces, such as, for example, a web browser interface providing device status, and an XML data stream sent to a customer's computer.

Customer environments 110, 120, and 130 are examples of remote locations at which data, such as temperature sensor data, may be gathered. Customer environments 110 and 120 are examples of computer data centers, and customer environment 130 provides an example of a mobile remote location, as it includes a refrigerated food truck 132. However, the invention is not limited to these examples of remote locations.

In the illustrated embodiment of a temperature monitoring system, devices in remote locations may incorporate or be electrically connected to temperature sensors, which may gather temperature data corresponding to their environment. Users of these devices may place the devices in close proximity to objects whose temperature they are interested in monitoring. For example, devices may be placed close to a particularly important server computer, or next to a perishable food item in a refrigerator truck. Devices may also be placed so that they monitor the ambient temperature of an environment, whether that be a computer data center, such as customer environments 110 and 120, or a mobile food truck, such as customer environment 130.

According to some embodiments, remote monitoring devices may be relatively simple and low cost devices. They may be positioned and activated at remote locations without any special wiring or installation procedures. For example, each remote device may be battery operated and communicate wirelessly with temperature monitoring server 106. Accordingly, installation of a remote monitoring device may be performed by connecting the device to a power source, such as a battery or AC output, and positioning the device in a location where temperature is to be measured. The simplicity of the remote monitoring devices allows the monitoring devices to be installed by a customer or other user of the system. Accordingly, remote monitoring devices may be distributed to customers for installation in customer environments.

Devices may be provided to users by any of a variety of distribution methods, including through retail establishments, and through direct orders with the device manufacturer. Regardless of the means of distribution of a remote device, each remote device may need to be registered with the central location in order to be used in the temperature monitoring system. Some devices may be distributed pre-registered, and other devices may need to be registered by the user of the device. Registration of the device may entail sending to the central location device-specific information, user contact information, monitoring preferences or other information used in monitoring for a customer environment where a device is to be installed. Various means of sending the necessary registration information may be employed, including physically mailing in a registration card. Registration may also be completed via the Internet or via a telephone, such as through a touch-tone or a voice-recognition interface. Though, any suitable mechanism may be used to convey registration data.

In the example illustrated in FIG. 1, in order to use a device in the temperature monitoring system, a user of the remote device may register the device with a web server 104, by providing to web server 104 registration data, such as device-specific information and monitoring criteria. Web server 104 may be loaded with HTTP server software, such as Apache HTTP Server or Microsoft Internet Information Services (IIS). Like database 108, web server 104 may be located on the same computing device as temperature monitoring server 106, or it may be located on one or more separate computing devices and may be connected to temperature monitoring server 106 via a communications link such as Internet 100. Web server 104 may alternatively or additionally be connected via a communications link to database 108, and may store the registration data in database 108.

In the example illustrated by FIG. 1, devices 140, 142, 144, 146, 148, and 150 are devices that gather data at customer sites 110, 120, and 130. Each device comprises a circuit component, such as circuit components 162, 164, 166, 168, 170, and 172, to which may be electrically connected a temperature sensor, such as temperature sensors 152, 154, 156, 158, and 160. The circuit components connected to temperature sensors may gather temperature data from their respective customer environments based on the sensor outputs and may communicate that data to the central location over a communication link. For example, temperature sensor 152 in device 140 gathers ambient temperature data reflecting the temperature of monitored server 112; temperature sensor 154 in device 142 gathers temperature data reflecting the temperature of monitored server 122, and temperature sensor 160 in device 150 gathers temperature data reflecting the temperature in refrigerated food truck 132 carrying refrigerated food item 134.

Devices at remote locations may be configured to send data to the temperature monitoring server 106 via a variety of communications links, illustrated in the example of FIG. 1 by Internet 100 and cellular network 102. The circuit component in each device may also be electrically coupled to a wired interface, such as wired interfaces 174, 176, and 178, allowing such devices to communicate with other computing devices, including the temperature monitoring server 106 over Internet 100. The circuit component may additionally or alternatively be coupled to a wireless interface, such as wireless interfaces 180, 182, and 184. Such devices may communicate over a wireless network, such as cellular network 102, with the temperature monitoring server 106.

Device 140 in customer site 110 is an example of a device, as is known in the art, that gathers temperature sensor data, but which has not been registered with the temperature monitoring system via web server 108. Device 140, in this example, does not send the data it gathers to temperature monitoring server 106. In this case, device 140 is connected via wired interface 174, such as a USB or Ethernet link, to a computing device at a customer site, such as client desktop computer 114. A software agent may be loaded onto the client desktop computer 114 to receive the temperature sensor data from device 140. The client desktop computer 114 may also have connectivity to an email server 118 over a private network 116. The client desktop computer 114 may process the temperature sensor data, and may send out an email alert via email server 118 if the temperature data is past a specified threshold.

In the operating state illustrated in FIG. 1, devices 142, 144, 146, 148, and 150 at customer environments 120 and 130 have been registered with the temperature monitoring system, and communicate with temperature monitoring server 106. Accordingly, they may send monitoring data, such as temperature sensor data, at periodic reporting intervals to temperature monitoring server 106 for processing and storing. The temperature monitoring server 106 may efficiently process the data, which may include comparing the temperature sensor data received from a device against location-specific monitoring criteria. The temperature monitoring server 106 may communicate instructions to the registered device in response to data it has received from the device, such as the time of the next reporting interval for the device.

After processing the data, the temperature monitoring server 106 may send customer alerts if, for example, the temperature sensor data from a device indicates an operating condition that deviates from an acceptable value or range of values. The temperature monitoring server may also send a customer alert if it fails to receive data from a device within an expected reporting interval or in response to other detected conditions. The temperature monitoring system may support different types of customer alerts. For example, it may send a phone call alert 197 or an SMS alert 198 to a phone number assigned to customer phone 136. The temperature monitoring server 106 may also send an email alert 199, which may be received by a customer on a computing device, such as customer laptop 126.

The temperature monitoring server 106 may also communicate data to a software agent 124. Software agent 124 may be a computing device at a customer site loaded with software configured to receive from the temperature monitoring server 106 temperature sensor data originating from one or more devices associated with the customer site. The data may be communicated as in an XML data stream or in any other suitable format. The data may be pulled by the agent from temperature monitoring server 106. Though, in other embodiments, temperature monitoring server 106 may initiate the data transfer. Regardless of how the data transfer is initiated or formatted, software agent 124 may perform one or more actions configured by the customer analyzing the data. For example, it may display a large message on a screen, trigger an on-site alarm, or execute another command specified by the user. In instances in which the agent is executing on a computing device being monitored, the agent may power itself down.

Any suitable processing may be performed by temperature monitoring server 106 to detect an out-of-range condition. For example, a customer site may include one or more heating, ventilation, or air conditioning (HVAC) units, such as HVAC unit 128 at customer environment 120. The typical operation of the HVAC unit 128 may produce a cyclical temperature pattern, which may be detected by the temperature monitoring server 106 by processing temperature sensor data sent from customer environment 120. If the temperature monitoring server 106 detects that the current temperature pattern deviates from the typical cyclical temperature pattern, temperature monitoring server 106 may send an alert to the customer, such as email alert 199, received on customer laptop 126.

The temperature monitoring server 106 may also communicate data in a fashion that affects operations at a customer site. For example, a circuit component with a transceiver adapted for communication with temperature monitoring server 106 may be coupled to an actuator at the customer site. A packet received from the temperature monitoring server 106 through the transceiver of the circuit component may control operation of the actuator. The circuit component coupled to the actuator may be a dedicated circuit component or may be a circuit component connected to a temperature sensor in a monitoring device. In the example of FIG. 1, a device, such as device 144, is also electrically connected to an actuator, such as actuator 192. Actuator 192 may be electrically connected to a power source 194, and may also be electrically connected to equipment at the customer site, such as HVAC unit 128. Actuator 192 may include a switch. In response to a command from the temperature monitoring server 106, device 144 may close the switch in actuator 192, causing the actuator to power on or power off the equipment, such as HVAC unit 128. For example, HVAC 128 may be a back-up air-conditioning unit, and the temperature monitoring server 106 may send a command causing actuator 192 to power on HVAC unit 128 if the temperature monitoring server detects that temperature sensor data from monitoring devices at customer site 120 indicate that the temperature is not within an acceptable range.

As noted above, monitoring devices may be easily installed. This capability allows for one monitoring device to replace another at the same location. Such a capability may be used, for example, in a scenario in which devices are battery-powered. When the battery power of one monitoring device runs low, the device may be replaced by another monitoring device with a charged battery. Similar replacement may occur if a device is defective or otherwise ceases to operate. Though the device monitoring a particular location changes, it may be desirable to associate temperature measurements made by the replacement device with the history established by measurements using the prior device. To allow multiple devices to be associated with the same location, temperature monitoring server 106 may support pooled devices. Monitoring reports from devices associated with the same pool will be identified by temperature monitoring server 106 as relating to the same monitored location. Customer environment 130 illustrates an embodiment of the invention in which devices are pooled. A device may join a pool of devices, such as devices 146, 148, and 150, in which the data from only one device is at a time, called the active device, is processed by temperature monitoring server 106, the other devices in the pool serving as back-up devices. In some embodiments of the invention, the configuration of a device pool may require registering a pool, including a list of devices associated with the pool, with the central location. As discussed above in conjunction with the registration of devices, the registration of device pools may be done by a variety of methods, including mailing in a registration card or communicating to the central location via the Internet or a telephone interface. In an embodiment of the invention, a user may register a device pool using a web browser interface by connecting to web server 104 over the Internet.

In the illustration of FIG. 1, device 150 corresponds to the active device in the pool, while devices 146 and 148 correspond to back-up devices. Devices 146, 148, and 150 may each comprise a rechargeable battery. Grouping devices in a pool allows a customer to make a quick substitution of the active device in a pool with a fully charged second device in the pool when, for example, the battery in the active device is depleted. While the active device is in operation, the battery of one or more of the back-up devices in the pool may be charging. In the illustrated embodiment, device 148 is currently charging its battery while it is connected to power source 196. The temperature monitoring server 106 may automatically change the currently active device when it detects a change in power state of devices in the pool, such as if the active device changes from running on battery power to using an external power source, such as power source 196 and/or an inactive device changes from running on an external power source to running on battery power.

Figure 2:
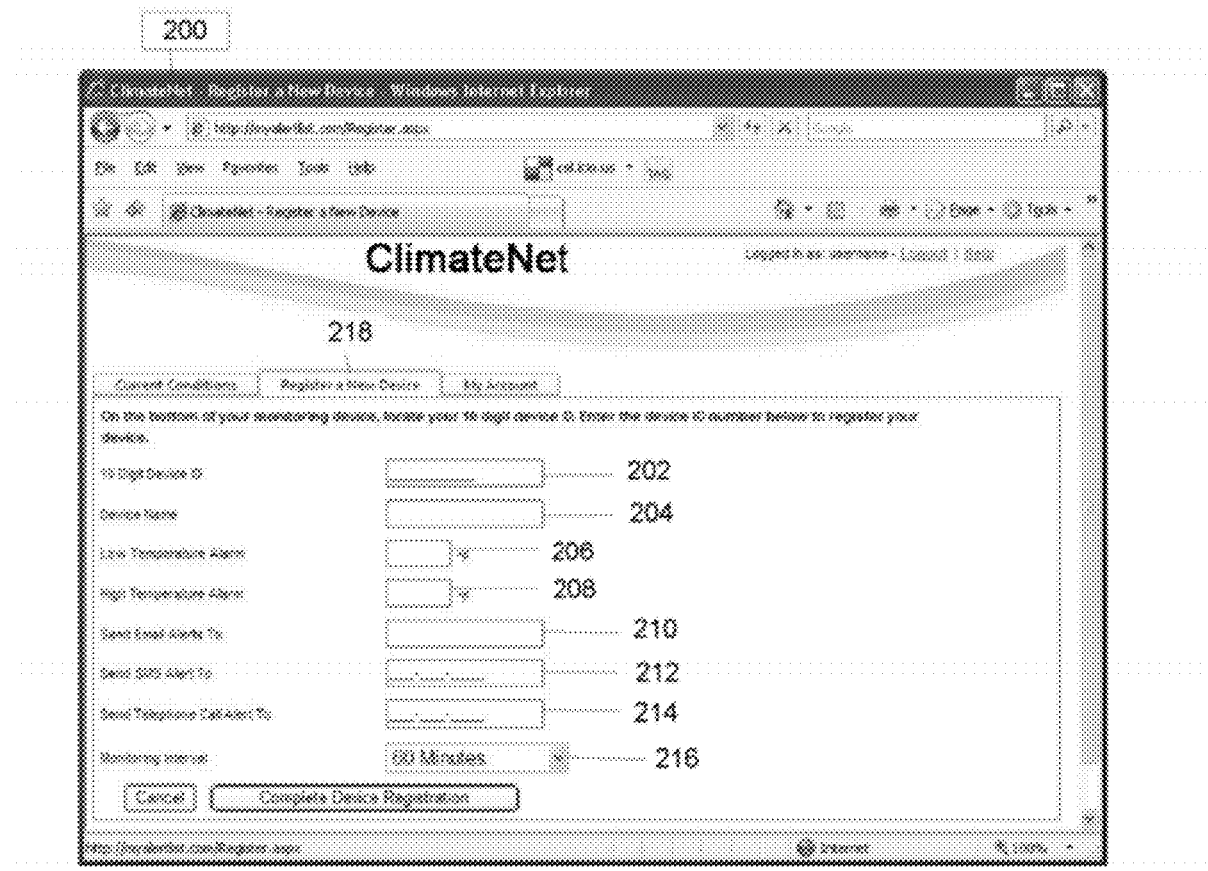
FIG. 2 is a sketch of a graphical user interface that may be presented by the system of FIG. 1 to a user registering a device.

As noted above, a device may be registered in any suitable way. However, in some embodiments, devices may be registered through a web-based user interface to temperature monitoring server 106. Such a user interface may be presented by temperature monitoring server 106 using techniques as are known in the art. FIG. 2 illustrates an interface for registering a new device with the temperature monitoring system, thus allowing communication between the device and the temperature monitoring server 106. A user may connect to web server 104 via a web browser interface 200.

The interface 200 may be presented on any web-enabled computer used to access temperature monitoring server 106. The user may select a portion of the interface for registering a new device, such as new device registration interface 218. The new device registration interface 218 may contain input fields, allowing the user to input registration data. For example, the interface may contain a device ID input field 202, into which the user may input a unique device identifier. In some embodiments of the invention, the device identifier is programmed in computer memory within a circuit component of the monitoring device before delivery to a customer. The device identifier may also be associated with the device in some way that it can be observed by a user and presented during the registration process. A simple mechanism for making the device identifier available to the user may be affixing a tag to the monitoring device on which the device identifier is printed. However, any suitable mechanism for making the device identifier available during the registration process may be employed. For example, each monitoring device may include a computer interface such that an agent executing on a computer displaying user interface 200 may access the stored device identifier within the circuit component of the device.

In addition to the device identifier, a user may also provide other information as part of the registration process. The user may also input a name for the device into a device name input field 204, allowing the user to associate a meaningful name with the device. The user can also input temperature monitoring criteria for the device into low temperature alarm input field 206 and high temperature alarm input field 208, specifying the minimum and maximum values, respectively, of an acceptable temperature range detected by the device. Though, any suitable temperature monitoring criteria may be supplied. For example, in some embodiments, a user may specify other criteria such as a maximum rate of change of temperature or a minimum or maximum period of temperature cycles. Accordingly, the invention is not limited by the nature of temperature monitoring criteria accepted by temperature monitoring server 106.

Other information provided during the registration process may include information allowing temperature monitoring server 106 to take action in response to detecting an impermissible temperature in accordance with the specified temperature monitoring criteria. For example, temperature monitoring server 106 may generate an alert message in response to detecting such a condition. In this scenario, the interface may also include an email address input field 210, an SMS alert input field 212, and a telephone number alert input field 214, for specifying the user's contact information if temperature monitoring server needs to send out an alert. The new device registration interface 218 may also include a monitoring interval input field, enabling the user to choose a default periodic time interval for which the device should regularly transmit data to the temperature monitoring server 106.

Figure 3:
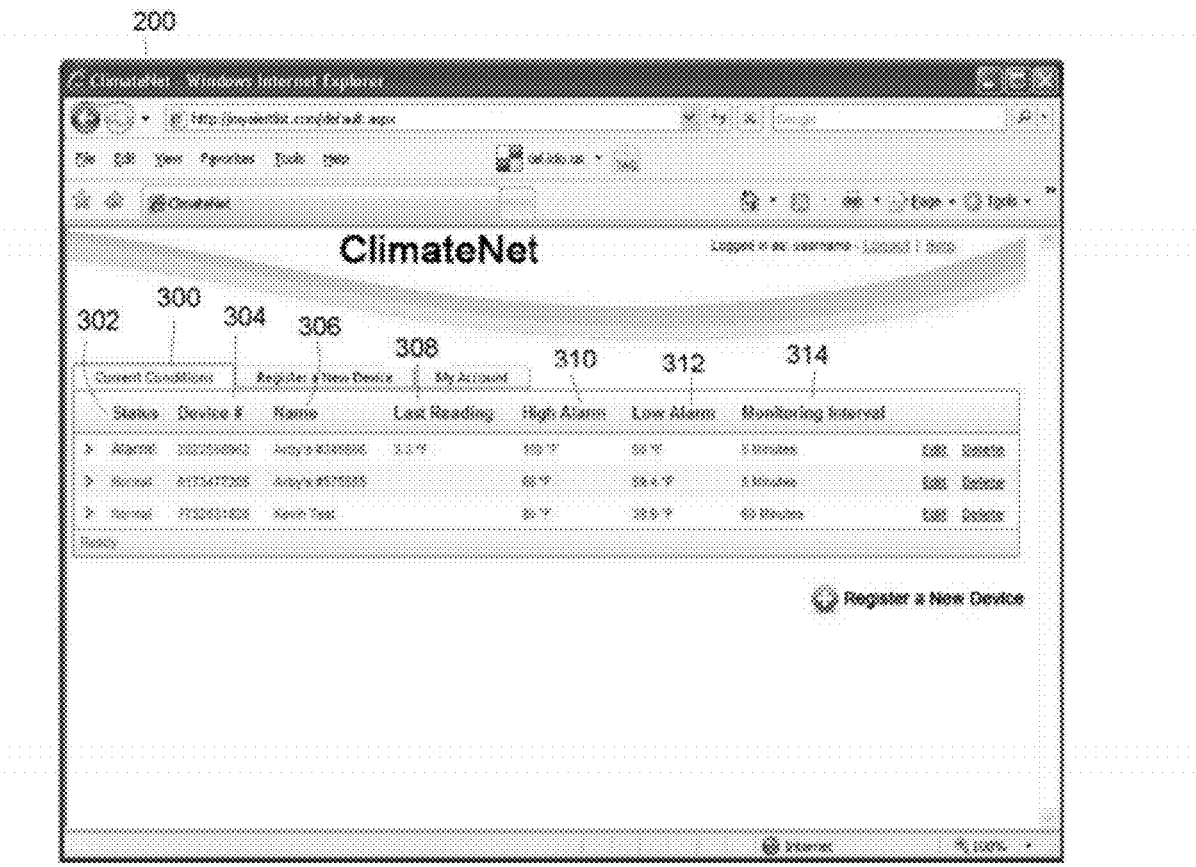
FIG. 3 is a sketch of a graphical user interface that may be presented by the system of FIG. 1 to a user accessing information about monitored locations.

As noted above, a user may access information about devices operated by the user through a web-based interface. The user may access information on registered devices through a different user interface than used to register devices. Though, in some embodiments, a single user interface may support different display areas through which a user may perform different functions associated with temperature monitoring at the user's locations. FIG. 3 illustrates another portion of the user interface, a current conditions interface 300, which may also be accessed using web browser interface 200. Current conditions interface 300 may display an overview of the current condition of each registered device to which a customer has access. Information in the display for each device may include a status indicator 302, which may indicate whether or not the temperature sensor data received from the device is normal. The information may also include a device ID indicator 304 and a device name indicator 306, displaying the device ID and device name received as input in the new device registration interface 218. The current conditions interface 300 may also display a last reading indicator 308, providing the latest temperature reading received from the device. Programmed monitoring conditions may also be displayed. For example, high alarm setting 310 and low alarm setting 312 display the current settings of the maximum and minimum acceptable temperatures, respectively, for each device. Monitoring interval display 314 may indicate the current monitoring interval for the device.

Figure 4:
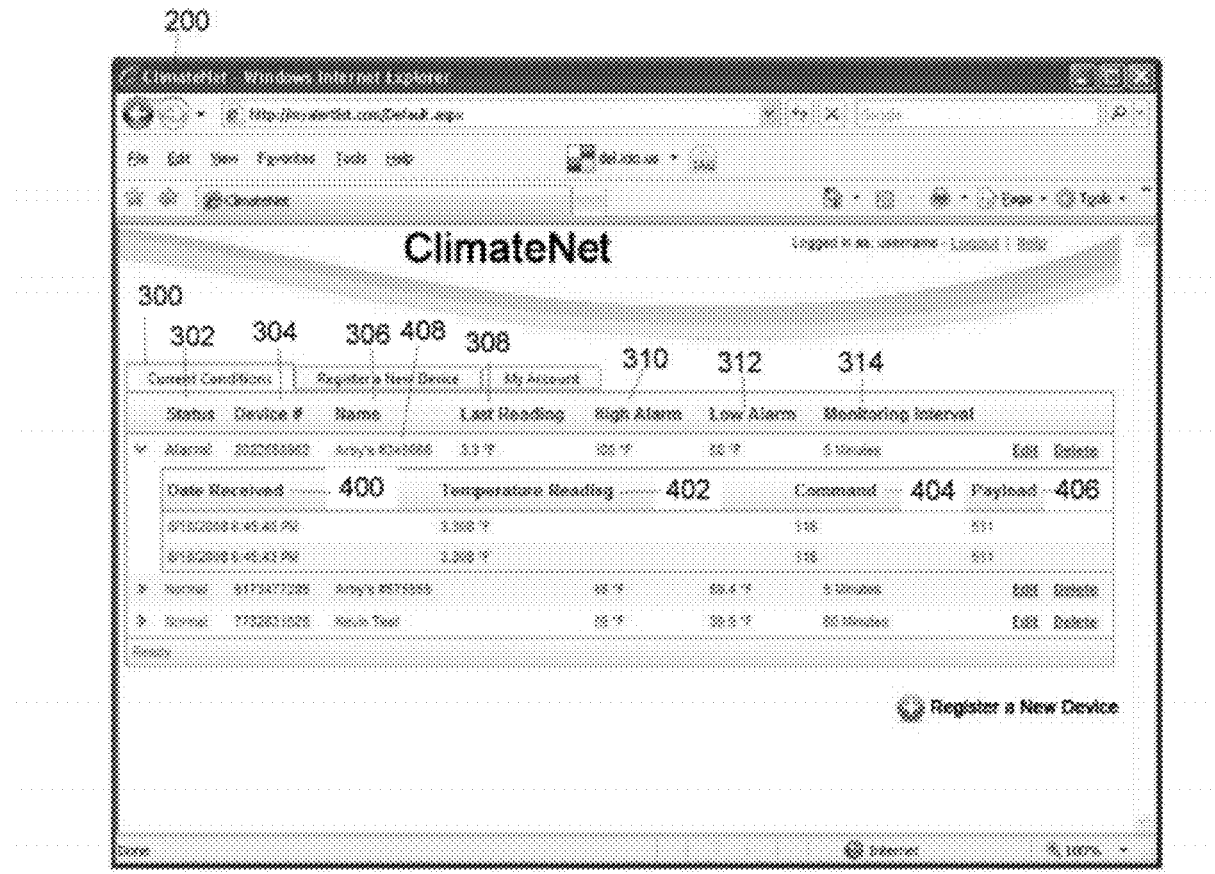
FIG. 4 is a sketch of the graphical user interface of FIG. 3 in an alternative operating state.

Any suitable amount of information may be displayed through a user interface. In some embodiments, a user interface 200 may support displays of different amounts of information based on user input. FIG. 4 illustrates another feature of the current conditions interface 300, in which the user has instructed the current conditions interface 300 to display more detailed information for one of the devices being monitored. In this illustration, the user has selected to view more detailed information for a selected device 408 with a status indicator 302 of "Alarm!" In the embodiment illustrated, the data from the last two sensor readings for the selected device 408 is displayed. For each of the last two sensor readings of the selected device 408, the current conditions interface 300 displays a time stamp 400 indicating the time when the sensor reading was received by the temperature monitoring server 106, as well as a temperature reading 402. A command ID 404 and command payload 406 is also displayed for each of the last two sensor readings.

Figure 5:
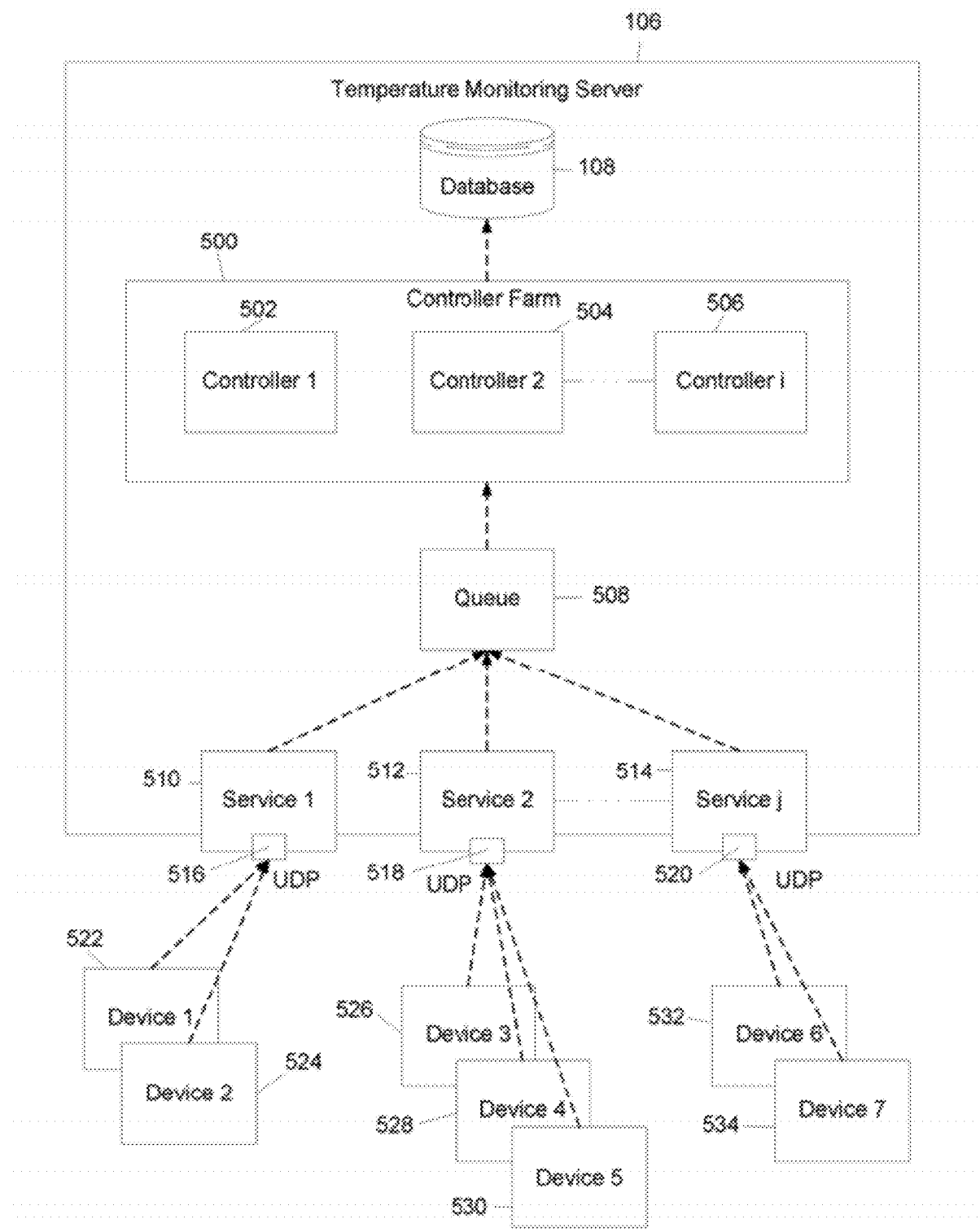
FIG. 5 is an architectural block diagram of components of the system of FIG. 1.

As described above in connection with FIG. 1, remote monitoring devices may be relatively simple to install and operate because they use a wireless network to communicate with the temperature monitoring server 106. In the illustrated example, the devices communicate over a cellular network. Though a cellular network provides the advantage of being widespread and easily accessible regardless of the customer locations at which monitoring is desired, transmission of data over a cellular network can be relatively expensive. Accordingly, remote devices and temperature monitoring server 106 may be configured to transmit a relatively small amount of data over the cellular network. For this approach to be effective, temperature monitoring server 106 must be configured to receive and accurately process the data from all remote monitoring devices coupled to the server. FIG. 5 illustrates an embodiment of the temperature monitoring server 106 adapted to receive and reliably process data from a large number of remote devices. It is to be appreciated that the various components illustrated in FIG. 5 may all be implemented in one computing device, or they may instead be spread across a number of computing devices interconnected by a computer network. For example, while database 108 is illustrated in FIG. 5 as a component of the temperature monitoring server, it may instead be its own computing device loaded with database software, as was illustrated by FIG. 1.

In an embodiment of the invention, the communication between the temperature monitoring server 106 and registered devices is via UDP. As is known in the art, UDP is a best effort protocol, unlike TCP which provides for error checking and re-transmission of lost packets. As a result of these differences, UDP, has a much smaller overhead compared to TCP in terms of the total number of bytes that need to be transferred over a communications link. This reduction in number of bytes transferred when using UDP versus TCP can provide a significant cost savings to users of the temperature monitoring system who might be charged by their telecommunications provider for the number of bytes transferred. This cost savings may be particularly relevant when transferring data over a cellular network, such as cellular network 102, in which data transfer rates typically are relatively expensive. In a typical implementation of a UDP server, however, packets can be easily lost when the UDP traffic overwhelms the server. In the embodiment of the temperature monitoring server 106 which communicates to devices via UDP, the temperature monitoring server may be able to process incoming device data in the form of UDP packets at a very high rate without the loss of data.

In the example of FIG. 5, registered devices 522, 524, 526, 528, 530, 532, and 534 may communicate with the temperature monitoring server 106 over one or more UDP interfaces, such as UDP interfaces 516, 518, and 520. A service may be associated with each UDP interface. For example, services 510, 512, and 514 are associated with UDP interfaces 516, 518, and 520, respectively. When a UDP message arrives from a registered device over a UDP interface, such as UDP interface 516, the associated service, such as service 510, may assign a thread from a pool of inactive threads to service the message. The assigned thread may validate the message, using a CRC, for example, break up the message into its component commands, validate each command, and place each valid command and its payload onto a shared queue 508.

After placing each command onto the shared queue 508, the assigned thread is free to service another message. The use of the shared queue allows the threads to rapidly service a message and move on to receive another message, and is particularly well suited to the distribution of services onto multiple computing devices. For example, services 510, 512, and 514 may run on separate computing devices, all having access to shared queue 508. This architecture allows for rapidly processing incoming requests and minimizes the likelihood that a UDP packet may be lost due to an overwhelming load on the temperature monitoring server 106.

One or more controllers, such as controllers 502, 504, and 506 may remove a command placed on the shared queue 508, and locate a processor that is able to process the command. In this context, each command indicates a type of action to be performed by temperature monitoring server 106 in response to a received message. Accordingly, a "command" may indicate that the message includes a temperature reading to be processed by temperature monitoring server 106 or that a remote device has changed state. Accordingly, any suitable processing may be performed in response to receiving a command.

As in the discussion with services 510, 512, and 514, in various embodiments of the temperature monitoring server 106, a computing device may run more than one controller, and controllers 502, 504, and 506 may be distributed across a number of computing devices. For example, each of the controllers may operate on a separate computing device. Alternatively, multiple controllers may be implemented through the use of software programming on a single computing device. In an embodiment, controllers are version-aware, and may be easily configured to handle new command types. Processors process a data payload in a command message, and may rely on database 108 for reading and writing data received from registered devices or for results of computations performed based on that data.

Figure 6:
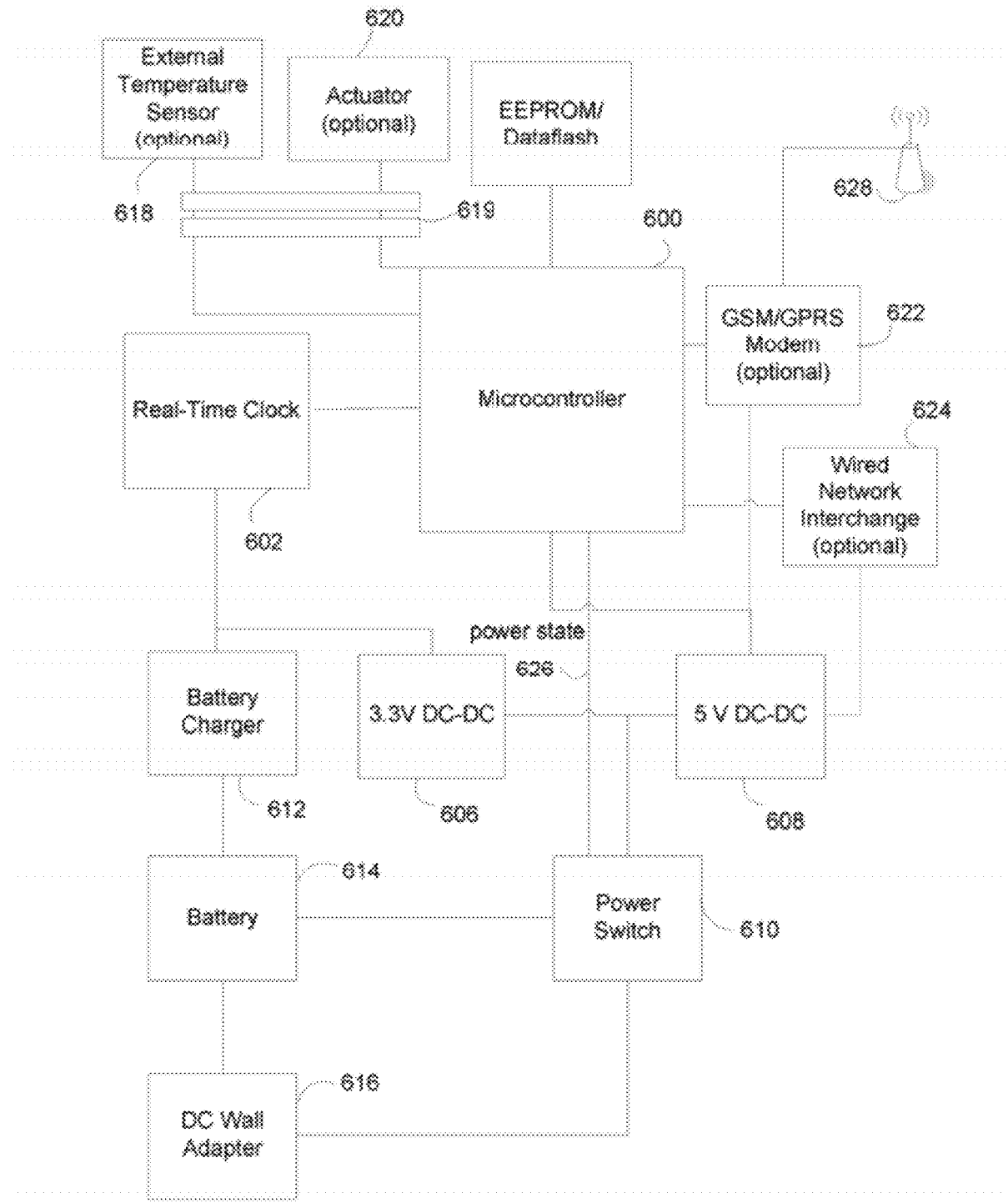
FIG. 6 is a block diagram of a remote device according to some embodiments of the invention.

FIG. 6 illustrates an embodiment of the components of a device, such as device 150, that may be registered with the temperature monitoring server 106. In the embodiment illustrated, a device configured to act as the remote device may include a sensor, such as temperature sensor 618 and/or an actuator, such as actuator 620. In addition, the device may include circuit components that convey information between the temperature sensor 618 and/or actuator 620 and the central location, such as temperature monitoring server 106. In the example of FIG. 6, the temperature sensor 618 and actuator 620 may be coupled to the circuit components through a separable interface 619. However, any suitable mechanism for integrating a temperature sensor and/or an actuator with circuit components may be employed.

In the embodiment of FIG. 6, circuit components of the device include a microcontroller 600, a real-time clock 602, a FLASH memory 604, one or more network interfaces, such as cellular modem 622 and/or wired interface 624, and a power system, which provides power to the components of the device.

In the embodiment illustrated, the power system includes components that enable operation from a rechargeable battery and/or from AC power from a wall outlet. Accordingly, in this example, the power system includes a rechargeable battery 614 and a DC wall adapter 616. A battery charger 612 may be coupled to receive power through DC wall adapter 616 and generate a charging current for battery 614. One or more voltage converters may be included in the power management system to generate power at voltages used by other components of the device. In the embodiment illustrated, a 3.3V DC/DC converter 606 and a 5V DC/DC converter 608 are shown. These converters generate 3.3V and 5V respectively. However, the specific power levels used by components within the device are not critical to the invention and any suitable power levels may be used. As shown, the power system of the device includes a power switch 610 that may select between battery 614 and DC wall adapter 616. Power switch 610 may be included to allow automated switching between battery power and power from DC wall adapter 616. For example, power switch 610 may be configured to switch to power from DC wall adapter 616 in scenarios in which such power is available, but to use power from battery 614 when power from DC wall adapter 616 is not available, which would occur in scenarios in which the device is not plugged in to an AC wall outlet or other source of AC power. The components of the power portion of the device illustrated in FIG. 6 may be components of the type used in portable electronic devices, but any suitable components may be used.

In the embodiment illustrated in FIG. 6, microcontroller 600 interfaces with each of the other portions of the device. Connections between the components illustrated in FIG. 6 may be made in any suitable way. For example, each of the illustrated components may be soldered to a printed circuit board or interconnected in any other suitable way.

Regardless of the manner in which connections are made between the components, those connections may enable the components to interact to perform functions of a remote device. As shown in FIG. 6, microcontroller 600 is coupled to FLASH memory 604. FLASH memory 604 may hold computer-executable instructions that can be executed by microcontroller 600 to perform monitoring functions. In addition, FLASH memory 604 may store a device identifier and other information used by a remote device as it operates in a monitoring system.

As shown, microcontroller 600 also interfaces with one or more network interfaces, such as cellular modem 622 or wired interface 624. Through these network interfaces, microcontroller 600 may exchange messages with a central location, such as temperature monitoring server 106. As shown, cellular modem 622 is coupled to an antenna 628 through which messages can be sent and received.

Microcontroller 600 may be programmed to obtain data from external temperature sensor 618 and formatted in a message that is transmitted over one or more of the supported network interfaces. The time at which such measurements are obtained and transmitted may be determined by operation of real time clock 602. In some embodiments, microcontroller 600, upon sending a message containing data obtained from temperature sensor 618, may set real time clock 602 at which a subsequent measurement is to be taken and transmitted. Accordingly, when real time clock indicates that the time has been reached, it may send a signal to microcontroller 600, triggering microcontroller 600 to obtain the subsequent measurement and transmit it. In this example, real time clock 602 may be implemented simply as a counter/timer circuit.

Microcontroller 600 may also be coupled to other circuit components that provide input data or trigger microcontroller 600 to perform some action. For example, power switch 610 is shown connected to microcontroller 600. In this embodiment, power switch 610 is configured to signal microcontroller 600 when the power state of the device changes such that the device changes from battery power to AC power or vice versa. Additionally, power switch 610 may be configured to provide to microcontroller 600 data indicating the current power state of the device. This information may trigger microcontroller 600 to send a message to the central location indicating a changed power state, as described in further detail below.

Messages received through one or more of the network interfaces may also trigger microcontroller 600 to take action. For example, in embodiments in which actuator 620 is present, a message containing a command to microcontroller 600 to operate actuator 620 may trigger microcontroller 600 to send control signals to actuator 620. As another example, the monitoring interval tracked by real time clock 602 may be established based on commands sent from the central location. In this embodiment, in response to a command specifying the next monitoring interval received through one of the network interfaces, microcontroller 600 may load a value into real time clock 602.

Microcontroller 600, real time clock 602, FLASH memory 604, wired network interface 624 and antenna 628 may be electronic components as are used in portable electronic devices as are known in the art. However, any suitable components may be used. These components may support low power modes of operation, such as conventionally called "sleep mode." For example, in sleep mode, microcontroller 600, modem 622 and network interface 624 may be powered down. These components may be powered up in response to an event indicating that the remote device should perform an action. Such an event may be generated, for example, by real time clock 602 indicating that the next monitoring interval has been reached or by power switch 610 indicating a change of power state of the device. Techniques for implementing such a sleep mode are known in the art, and may be employed in a remote device as illustrated in FIG. 6. However, any suitable techniques may be employed.

External temperature sensor 618 and actuator 620 may also be devices as are known in the art. However, any suitable sensor and actuator devices may be employed.

Figure 7:
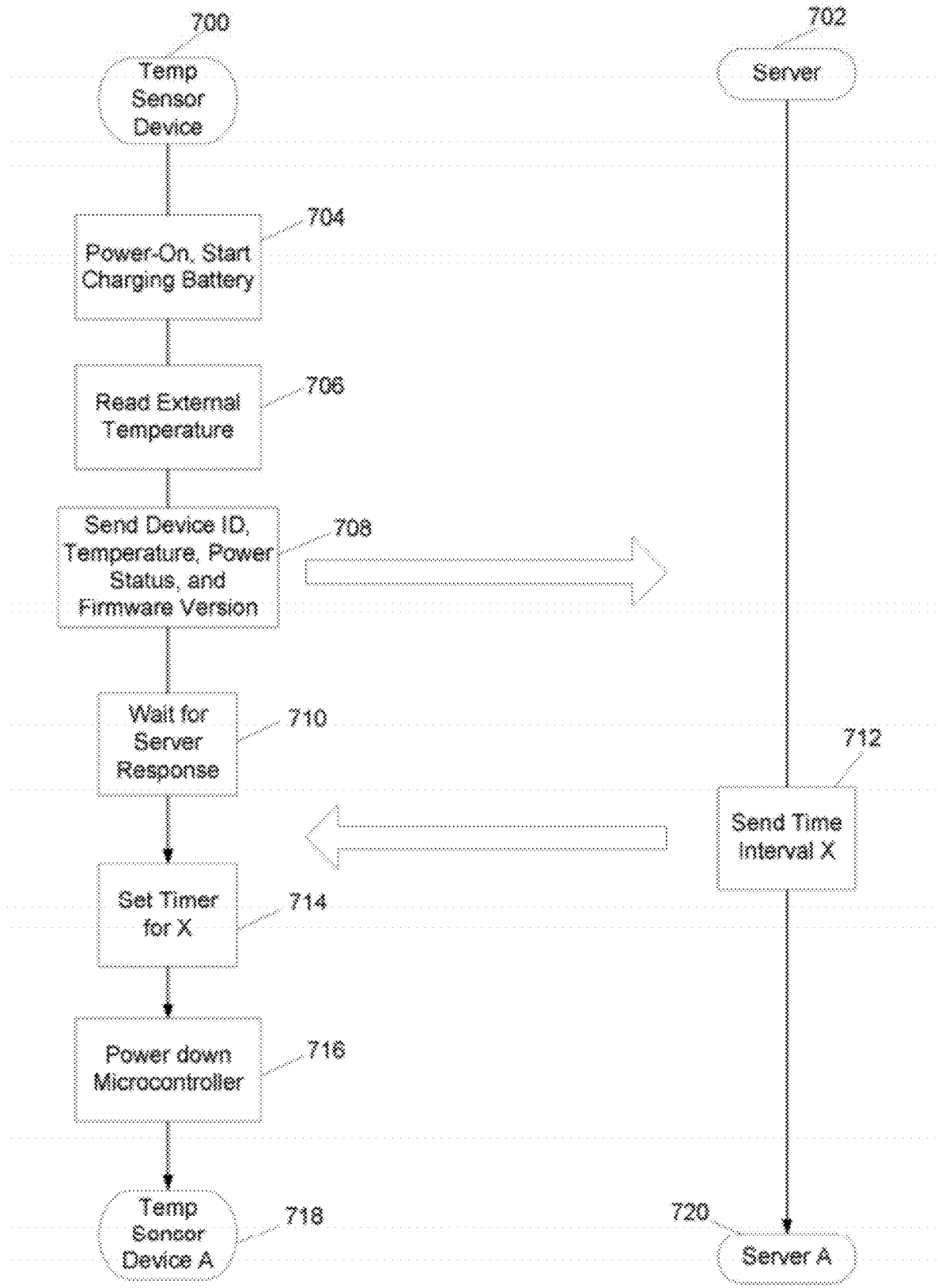

FIG. 7 is a flowchart for an illustrative embodiment of the interaction between a device 700 equipped with a temperature sensor and a central location such as a server 702, starting at the point when device 700 is first powered on. Server 702 may be configured as a temperature monitoring server. When the device is first powered on in step 704, it starts charging its battery. In step 706, device 700 gathers a reading of its external temperature. In step 708, device 700 then sends to server 702 the temperature reading gathered in step 706, along with its device ID, power status, and firmware version. Device 700 then waits for the server response in step 710.

Upon receiving the device's data, server 702 sends a time interval X to device 700, indicating the time interval to the next temperature reading from device 700. In step 714, device 700 sets a hardware timer to wake up at the end time interval X. Device 700 then powers down the microcontroller in step 716, though the real-time clock may continue to run. This represents the end of the initial power-on sequence. The flow chart continues at block 718 and 720 of FIG. 8A.

Figure 8A:
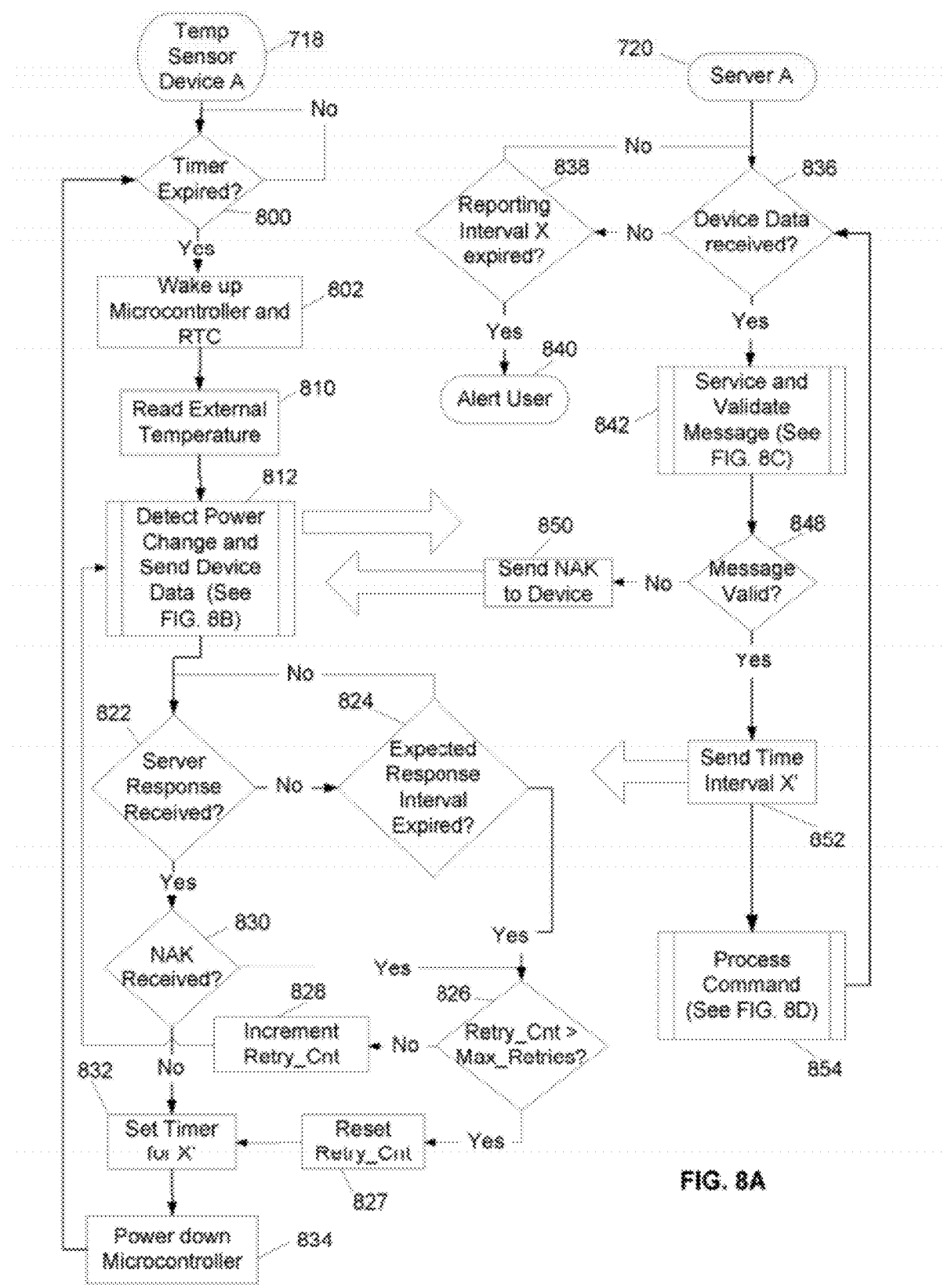
FIG. 8A is a flowchart continuing the process of FIG. 7.

FIG. 8A continues where FIG. 7 left off, and illustrates an embodiment of the main control flow between a remote device that is powered-on and equipped with a temperature sensor and a server, which may be configured as a temperature monitoring server. It should be appreciated that, similar to the discussion in conjunction with FIG. 5, while the functionality ascribed to the server in the discussion that follows may suggest that it is all performed by the same server computing device, the server may in some embodiments be implemented by multiple computing devices configured to act together as a cohesive system. In some embodiments, multiple server computing devices implementing the server may each perform different portions of the functionality ascribed to the server. In other embodiments, there may be multiple server computing devices performing the same functionality as one another, but configured to evenly distribute incoming data from remote devices. Some combination of these two approaches is also possible in still other embodiments.

Regardless of the hardware components on which the process of FIG. 8A is performed, the process continues at block 800. At block 800, the remote device repeatedly checks if its timer (set to X in step 714) has expired. If the timer has expired, the flow proceeds to step 802, in which the microcontroller and any other components of the remote device in a "sleep" mode may wake up in response to an output of the real-time clock. The remote device then may read the external temperature from a temperature sensor in block 810. In block 812, the remote device may then detect any power change and send device data to the central server. More details for step 812 are provided in FIG. 8B.

Turning momentarily to FIG. 8B, at step 814, the remote device checks to see if its power state has changed. If the power state has not changed, the control flow proceeds to block 816, in which the device sends its device ID and latest temperature reading gathered in step 810 to the central server. If the power state has changed, however, the flow proceeds instead to block 818, in which the device may store its new power state in internal memory. In block 820, the device sends to the central server its device ID, new power status, and latest temperature reading.

Turning back to FIG. 8A, at block 836, the central server checks to see if it has received data from the remote device. If not, it checks at block 838 if the expected reporting interval X has expired. If it has, the server may, at step 840, send an alert to the user. As discussed above, the alert may take one of various forms, including email, SMS, or phone call. On the other hand, if the central server has received data from the device, it proceeds to step 842 in which it services and validates the message received. More details of step 842 are provided in FIG. 8C.

Turning momentarily to FIG. 8C, at block 844, the central server may assign a thread from a thread pool to service the received message. In servicing the message at block 846, the thread may validate the message. In an embodiment of the invention, messages sent from the remote device include an error detecting code, such as a cyclic redundancy check (CRC). Validating the message includes checking that the message has been received without an error by checking that it has a valid CRC. Validating the message may also include checking that any commands in the message are valid. As noted above, each message that causes the central server to perform an action may be regarded as a command. In some embodiments, the system is configured to recognize a limited number of such actions. A valid command includes a code identifying one of the limited number of actions to be taken. Processing at block 846 may include comparing a value in a received message to a list of codes corresponding to the recognized commands. However, any suitable processing may be used to validate a message.

Turning back to FIG. 8A, based on the output of the computation of block 842, the server may then check in step 848 to see if the message is valid. If it is not valid, the server may indicate this to the remote device. In an embodiment of the invention, the central server does this in step 850 by sending to the remote device a special non-acknowledgment packet, called a NAK. If the server determines instead that the message is valid in step 848, it then sends to the remote device a new time interval X' in step 852. In some embodiments, the new time interval X' may be the same as the interval X provided at block 712 (FIG. 7). However, as described below, in situations in which a remote device reports a temperature that is near or exceeds a limit of acceptable operation, the monitoring interval may be reduced. Accordingly, the time interval X' sent at step 852 alternatively may be different than a previously supplied monitoring interval. At step 854, the server processes the command. More details of step 854 are provided in FIG. 8D.

Turning momentarily to FIG. 8D, at step 856, the server may place each command on a shared queue. At step 858, the server selects a processor to process each command. In an embodiment of the invention, this step may be done by one of multiple controllers that removes the command from a shared queue. For example, the controller may locate a processor appropriate for the command, possibly taking into account command version information, in which case it would find a processor which can support the version of the command sent by the remote device.

In step 860, the assigned processor processes each command. More details of step 860 are given in FIG. 13, which will be discussed below. Step 860 may include, inter alia, analyzing the temperature sensor data according to monitoring criteria, sending out customer alerts if the temperature data lies outside of a specified range, storing the gathered data and the results, and computing a new time interval. Control then proceeds back to block 836 in FIG. 8A, in which the central server waits for the device data.

Returning to FIG. 8A, at block 822, the remote device checks to see if it has received a response from the server. If it has received a response, it proceeds to step 830, where it checks to see if the response is a NAK. If the response from the central server is not a NAK, in step 832, the remote device sets its timer for the new time interval X' contained in the response from the server. X' may differ from X, if for example, the server detected that the latest temperature reading is not within a specified range, in which case the central server may send a value X' that corresponds to a more frequent reporting interval than X. After setting its timer for X', the remote device may power down its microcontroller and possibly other components in step 834. Control then proceeds back to block 800 in which the remote device checks to see if its timer expired.

Returning to block 822, if the remote device determines that it has not received a response from the server, it may check in block 824 whether the expected response interval has expired. In an embodiment of the invention, the remote device may be configured with a time interval, which may differ from X or X', in which the remote device expects a response from the central server. If the expected response interval has not expired, control proceeds back to block 822.

If, on the other hand, the remote device determines that its expected response interval has expired, it proceeds to step 826, in which it checks to see if it has exceeded the maximum number of retries. In an embodiment of the invention, the device is configured to retransmit its message to the server up to a maximum number of retries. The device may have been pre-configured with this maximum number, or the maximum number may be configurable by the user of the device or, in some embodiments, may be sent in a command from a central server. Regardless of how this value is specified, if the retry count has not exceed the maximum number of retries, the retry count is incremented at step 828 and the process returns to block 812 where the device data is retransmitted. If, on the other hand, the retry count has exceeded its maximum number, the remote device resets its retry count at step 827. The process then proceeds to block 832, in which the remote device sets the timer for X, powers down the microcontroller in step 834, and returns to step 800, in which it waits for the timer to expire.

Returning to block 830, if the remote device determines that a NAK was received, it proceeds to step 826, in which it checks to see if the retry count has exceed the maximum number of retries. In an embodiment of the invention, the retransmission logic upon receiving a NAK may be identical to the retry logic upon detecting that the expected response interval has expired. It is to be appreciated, though, that in other embodiments, these two conditions may be treated differently by the remote device, for example, by retrying a different number of times if one condition is encountered versus the other. The processes in FIGS. 7, 8A, 8B, 8C and 8D illustrate a central server communicating with a single remote device. Any number of remote devices may be incorporated into a system, and each remote device may communicate with the central server at asynchronous times. Accordingly, though FIGS. 7 and 8A . . . 8D illustrate a linear flow, the processing represented in those figures may be performed in any number of parallel paths and may be duplicated for any number of remote devices communicating with a central server Likewise, when multiple central servers are available, the processing may also be duplicated on any number of central servers.

Figure 9:
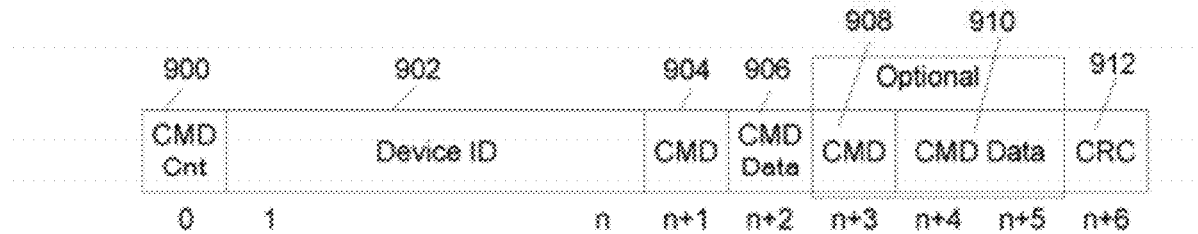
FIG. 9 is a sketch illustrating the structure of a packet communicated between a remote device and a central server according to some embodiments of the invention.

FIG. 9 illustrates a possible embodiment for the internal protocol and the format of a message sent between a remote device and the temperature monitoring server 106. As discussed above, in one embodiment of the invention, the messages are sent using a best-efforts protocol, such as the UDP protocol, which has a much lower overhead in terms of number of bytes transferred compared to TCP. In the embodiment illustrated, each command is sent as a single UDP packet. It should be appreciated, however, that the message illustrated in FIG. 9 may be sent over any suitable transport protocol, including TCP.

The format for messages exchanged between remote devices and the temperature monitoring server 106 may begin with a one-byte command count field 900, which specifies the number of commands contained within the given message. Following command count field 900 may be a device ID field 902, of size n bytes, which uniquely identifies the remote device. Following device ID field 902, may be a one-byte command ID field 904, specifying a command identifier for a particular command. Valid command identifiers will be discussed below. A command data field 906 may immediately follow command ID field 904, containing the data payload associated with the command in command ID field 904. Command data field 906 may be one byte in size, but the size of command data payloads in general may be variable, depending on the type of command. For example, a command carrying a temperature reading may have more bytes of payload data than a command indicating that a power change has occurred. Following the first command ID and command payload may be one or more additional commands with their associated payload. In this illustration, one-byte command ID field 908 follows command data field 906. Command data field 910 follows, containing the data payload for the command in command ID field 908. Note that in this illustration, command data field 910 is two bytes in size, indicating that the command in command ID field 908 requires two bytes in its data payload. Following the data payload for the last command in the message may be a CRC field 912, containing a CRC value for the entire message, which may be validated by the temperature monitoring server 106, as described in conjunction with FIGS. 8A-8D.

Table 914 contains a chart of valid commands in some embodiments of the protocol between a remote device and the temperature monitoring server 106. As can be seen from table 914, in this embodiment, a remote device can send at least three commands, u, t, and p. Command u may have a data payload of length one byte. It may contain the firmware version and an indication that the device has just powered on. Command t may have a length of two bytes, and may contain a temperature reading for the remote device. Command p may have a length of one byte, and indicates a power change, such as between running on battery power versus running on an external power source. In this illustrated protocol, the temperature monitoring server 106 may send at least one command, i, of length one byte, which contains the new reporting interval for the remote device.

In keeping with the desire in some embodiments to keep the number of bytes transferred between remote devices and the temperature monitoring server 106 to a low number, the illustrated message format uses a minimal number of bytes. Other embodiments of the protocol are certainly possible, including the addition of command types that can be sent by both the remote device and the temperature monitoring server 106.

Also in keeping with the desire to keep each remote device simple, the embodiment of FIG. 9 illustrates that a remote device may be implemented to generate and respond to a small number of commands. In the specific example of FIG. 9, each device needs to generate only three types of messages and respond one type of message. Moreover, the remote device can generate or respond to each type of command with relatively simple processing, yet relatively complex functioning can be implemented. One of the functions that may be implemented is pooling of devices.

As discussed in conjunction with FIG. 1, in some embodiments, the temperature monitoring system may support grouping two or more remote devices configured to operate at the same location into a device pool. Pooling may be useful in mobile environments in which the remote devices need to run on battery power. While one active device in the pool is running on battery power, other devices in the pool may be charging or may be powered off in order to conserve their battery life. When the battery of the currently active device is depleted, it may be swapped out for another fully charged device in the pool. According to some embodiments, the temperature monitoring server 106 may recognize devices associated with a pool and identify which device is the currently active device.

In some embodiments, remote devices may need to be registered with the temperature monitoring system as members of the pool. The devices may be registered as members of a pool through a web-based interface or other suitable mechanism. Though, in some embodiments, if requested by a customer, remote devices may already be preconfigured in device pools before being shipped to a customer. Other embodiments may require or offer to the customer the flexibility to configure one or more device pools himself after having purchased and received the devices. In either scenario, the temperature monitoring server 106 may need to be made aware in some fashion of the existence of a device pool, including the knowledge of which devices may comprise the device pool.

Figure 10A:
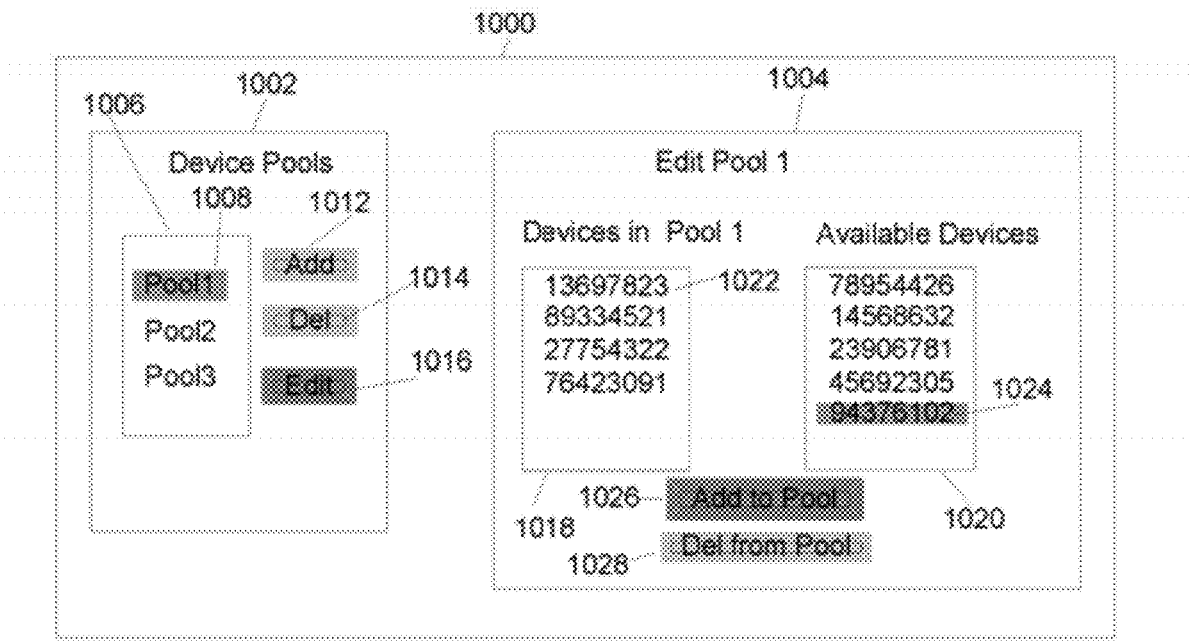
FIG. 10A is a sketch of a graphical user interface that may be presented by the system of FIG. 1 to a user defining pooled devices.
Figure 10B:
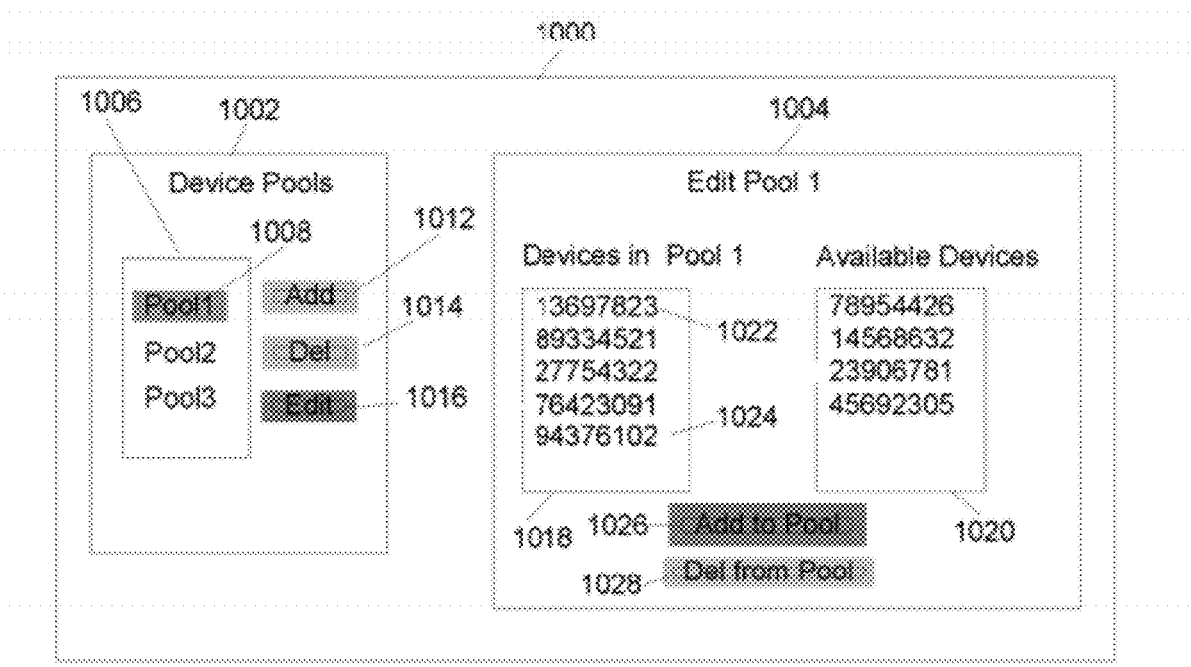
FIG. 10B is a sketch of the graphical user interface of FIG. 10A in an alternative operating state.

FIGS. 10A and 10B illustrate a user interface for configuring device pools. In some embodiments, the user interface may be utilized by the manufacturer of the remote devices if the devices are configured before being shipped to a customer. In other embodiments, the customer may access the user interface himself. As in the case of registering devices with the temperature monitoring server 106, discussed in conjunction with FIGS. 1 and 2, any suitable means may be employed for the configuration of device pools, including configuring a device pool over the telephone or the Internet 100. In the illustrated embodiment of the user interface, users may configure device pools using a computer application having access to Internet 100. This may be a locally installed application that shipped with the remote device or that was made available to users for this purpose, and which connects over Internet 100 to one or more computing devices at the central location. Or it may be a web browser application that connects to a web server, such as web server 104. Though, regardless of when or how the user interface illustrated in FIG. 10A is accessed, information entered through the user interface may be stored for use by a central server when responding to commands received from remote devices.

Focusing on FIG. 10A, a device pool enrolling interface 1000 comprises a window 1002 to add, delete, or edit a device pool. Window 1002 has a device pool name list 1006, listing the names of device pools already created to which the user of the interface 1000 has access. In the illustrated embodiment, the user of the interface has selected one device pool 1008 from device pool name list 1006. Window 1002 also has add device pool control 1012, delete device pool control 1014, and edit device pool control 1016. Each of these controls may be implemented using techniques as known in the art for implementing a graphical user interface. For example, each control may be associated with a computer program component that is invoked when the user indicates the selection of that control. However, the specific mechanism by which each graphical user interface is implemented is not critical to the invention, and any suitable mechanism may be used.

In the illustrated operating state, the user has selected the edit device pool control 1016, perhaps by clicking a mouse connected to a computer displaying interface 1000 on control 1016, in effect requesting to edit selected device pool 1008.

This user action displays a window 1004 to add or delete devices in a device pool, in this case device pool 1008. Window 1004 may comprise a list 1018 of devices in the selected pool, which may be listed by device ID, as well as another list 1020 of available devices, which also may be listed by device ID. Though, any suitable identification mechanism may be used for devices in the pool or available for inclusion in the pool. For example, in embodiments in which a user supplies a name for a device in conjunction with registering the device, interface 100 may display devices using the provided name.

The list of available devices may be obtained in any suitable way. In embodiments in which each user registers multiple devices, the list of available devices may include all devices previously registered to that user, for example. Window 1004 may also comprise an add to device pool control 1026 and a delete from device pool control 1028. Device 1022 is an example of a device currently assigned to device pool 1008. Device 1024, which the user of the interface has selected in this illustration, is an example of an available device not in any device pool. In the illustrated embodiment, the user has selected the add to device pool control 1026, perhaps by clicking his mouse on the button 1026, in effect requesting to add device 1024 to the devices in device pool 1008.

FIG. 10B illustrates the result of this action. List 1018 of the devices in the selected pool 1008 now displays device 1024, along with the devices that were previously in the pool in FIG. 10A. List 1020 of the available devices in the selected pool 1008 now no longer lists device 1024. Accordingly, device 1024 has been added to device pool 1008.

FIG. 11 displays an example of swapping the currently active device in a device pool with another device in the pool. It illustrates a modification of customer environment 130, which includes a device pool, from FIG. 1. Referring back to FIG. 1, devices 146, 148, and 150 are in a device pool, with device 150 as the current actively monitored device. In this illustration, the current actively monitored device is stationed in refrigerated food truck 132, and is used to monitor the ambient temperature of the section of the truck containing perishable food. Devices 146 and 148 are back-up devices, and are not currently being monitored by temperature monitoring server 106. The battery in device 148 is charging from power source 196. Device 146 may be powered off in order to conserve its battery life. Though, in some instances, devices that are not the active device may transmit temperature measurements. In some embodiments, temperature monitoring server 106 may, even if it receives commands from devices 146 and 148, ignore those commands in determining the temperature at the specified location for the pool, in this example within refrigerated food truck 132.

In FIG. 11, device 150 was removed from the refrigerated food truck 132, and is currently charging its battery using power source 196. Thus, device 150 is currently no longer the actively monitored device; it is now a back-up device. Device 146 has since been powered on and taken the place of device 150 in the refrigerated food truck 132, and has become the current actively monitored device. Device 148, still a back-up device, is now presumably fully charged and powered off, in order to conserve its battery life. In some embodiments, the devices are configured to send a change of power status command to temperature monitoring server 106. Temperature monitoring server 106 may use such commands to identify when one device has been replaced by another as the active device by detecting that its power state has changed. Though, other mechanisms may be used alternatively or additionally to identify the active device. For example, a user may input through a web-based user interface or other suitable mechanism an indication that the user has changed the currently active device. However, by automatically recognizing the active device based on changes in power state of devices within the pool, use of the system is simplified. In some instances, if a user configures multiple devices in power states that prevent the server from identifying the currently active device, the central server may send an alert to the user, prompting the user to either modify the state of one or more of the devices or to provide input identifying the currently active device. Accordingly, any suitable mechanism may be used to identify a currently active device.

Figure 12:
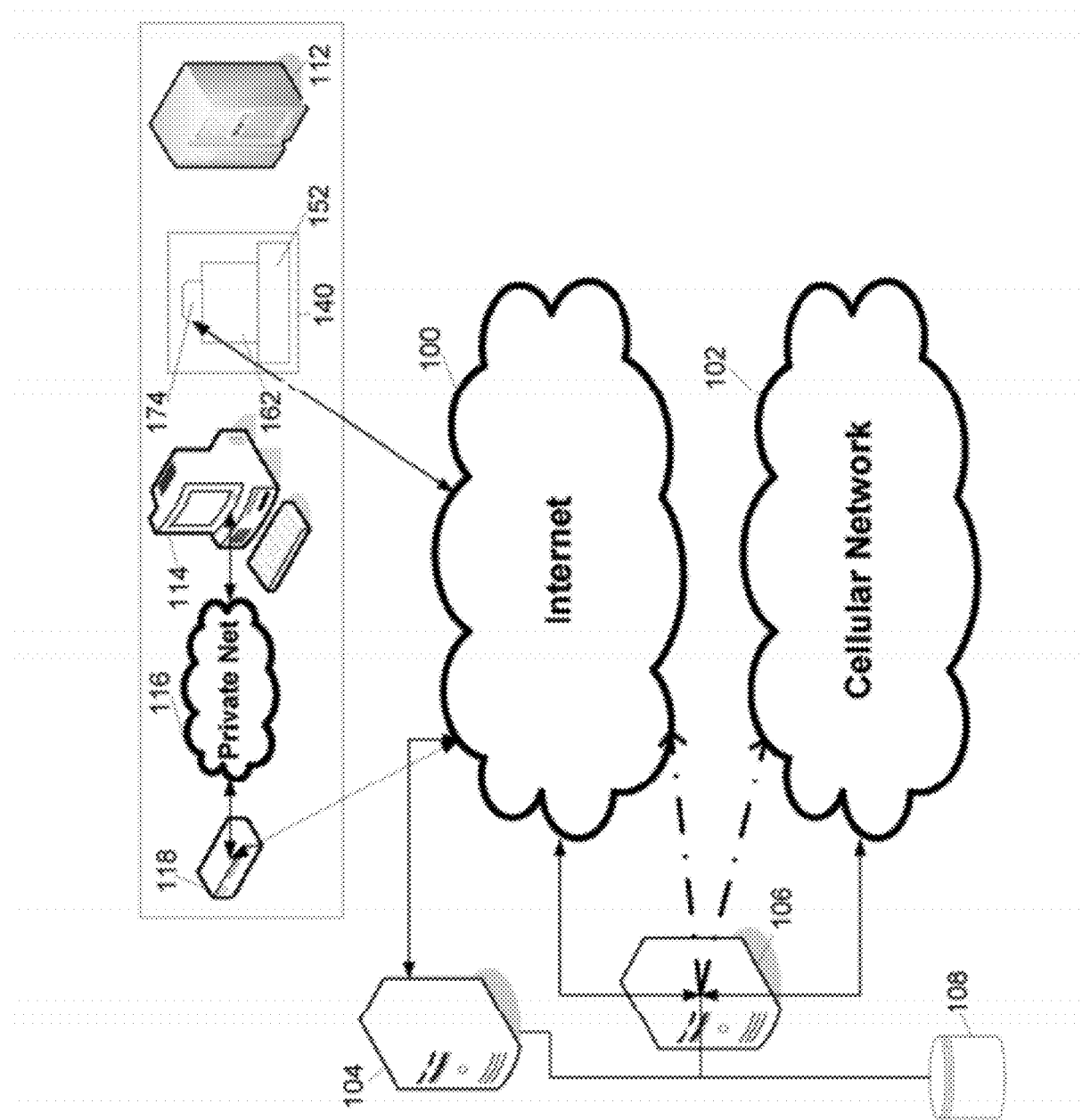
FIG. 12 is a sketch of a portion of the system of FIG. 1, including a remote location at which a remote device is reprogrammed for interaction with a central server according to some embodiments of the invention.

FIG. 12 illustrates another feature in an embodiment of the invention, the reprogramming of legacy devices to allow them to communicate with the temperature monitoring server 106. As was described in conjunction with FIG. 1, device 140 is a prior art device, which includes a temperature sensor and a connection to a client desktop computer 114 through its wired interface 174. Device 140 is not registered with the temperature monitoring system, and in some embodiments of the invention, it cannot provide data that will be recognized by the temperature monitoring server 106. Instead, device 140 sends data through its wired interface to desktop 114, which has been specially configured with software to analyze the temperature sensor data and communicate with email server 118 to send out email alerts if the data exceeds a threshold, for example.

In an embodiment of the invention, the firmware on legacy devices, such as device 140, may be upgraded to a version which allows the device the possibility of registering with the temperature monitoring system. This may be done, for example, by storing a new firmware version in the FLASH memory of the device.

FIG. 12 shows the result of reprogramming legacy device 140 with upgraded firmware, and registering the device with the temperature monitoring system. Reprogrammed device 140 no longer relies on client desktop computer 114 to analyze the temperature sensor data and to send alerts through email server 118, as before. Instead, reprogrammed device 140 now may communicate directly with the temperature monitoring server 106 over the Internet 100. It should be noted that the device reprogramming feature in some embodiments of this invention is not limited to devices with wired interfaces. Legacy devices with a wireless interface, such as a cellular interface or a wireless computer interface implementing an 802.11x protocol, may also be reprogrammed to be able to communicate with the temperature monitoring system.

Figure 13:
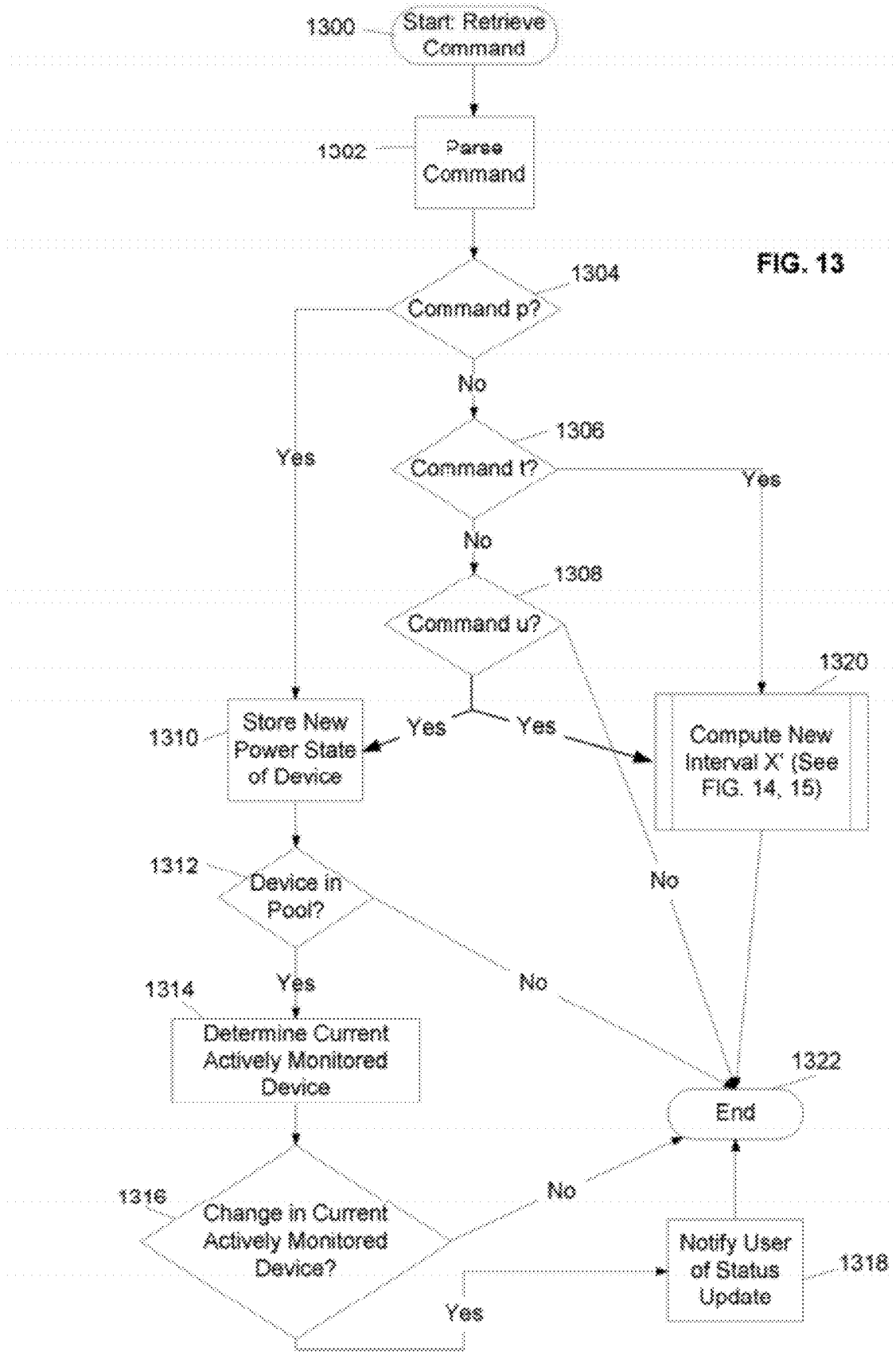
FIG. 13 is a flowchart illustrating processing of commands at a central server according to some embodiments of the invention.

FIG. 13 illustrates a flowchart for an embodiment of a command processor, providing further details for step 860 in FIG. 8D that may be performed when pooled devices are supported. As in the prior discussion, the command processor may be implemented on the same computing device as the temperature monitoring server 106, or it may be implemented on one or more separate computing devices. In an embodiment of the invention corresponding to the execution of step 1300, a command controller has retrieved the command from the shared queue 508 and assigned it to a processor. In step 1302, the controller may parse the command to identify a value indicating the type of command.

At step 1304, the process branches depending on whether the command is p, indicating a change in power state. If it is, control proceeds to block 1310, in which a command processor for p commands stores the new power state of the device. While the power state may be stored in any computer storage medium, in an embodiment of the invention, the power state is stored in database 108. In step 1312, the processor checks to see if the device is in a device pool. If it is not in a pool, the processor may proceed to end block 1322, as it may have finished processing the command.

If the processor determines in step 1312 that the device is in a pool, it may proceed to determine the current actively monitored device in step 1314. In an embodiment of the invention, the processor may automatically determine the current actively monitored device. In some embodiments, all devices in a pool which are powered on continue to transmit data to the temperature monitoring server 106. The temperature monitoring server 106 may receive the data from all powered on devices in a device pool, regardless of whether they are the current actively monitored device, and may respond back to all devices in the pool with a time interval, as the devices would expect. In some embodiments, however, the temperature monitoring server 106 only processes and stores temperature data from the current actively monitored device. This has the advantage of keeping the device circuitry simple, which usually also correlates to a lower production cost for the device.

While the temperature monitoring server 106 may use various means for determining the current actively monitored device, in some embodiments, the temperature monitoring server 106 determines the current actively monitored device based on a change in power state. In this embodiment, the server treats the device which most recently switched to battery power as the current actively monitored device. This calculation by the temperature monitoring server 106 of the device which most recently switched to battery power may be made by maintaining on the temperature monitoring server 106 a time-ordered list of devices in the pool that have switched to battery power, with the most recent device appearing at the top of the list, this top device being considered the current actively monitored device.

In step 1316, the command processor checks to see if there is a change in the current actively monitored device. If there is no change, the control flow may proceed to end block 1322, as the command processor may be finished processing the command. If the current actively monitored device has changed, in step 1318, the command processor may notify the user of the status update reflecting the new current actively monitored device. The user notification of the status update may be performed in a variety of ways, such as a phone call, an SMS message, or an email message. If the user did not intend to change the current actively monitored device, notification of the change of current actively monitored device may prompt the user to take corrective action. That corrective action may include changing the power states of one or more of the pooled devices. For example, the user may insure that only one device is on battery power by removing the batteries from devices that are not intended to be active or placing them in their chargers. Though, corrective action may include providing input to temperature monitoring server 106 through a web-based interface or using any other suitable mechanism. The control flow may then proceed to end block 1322.

Returning to step 1304, if the current command is not p, the process proceeds to step 1306 where a check is made of whether the command is t. If it is, in step 1320, a command processor processes the new temperature reading and possibly computes a new interval X'. More details of this step may be provided in either FIG. 14 or FIG. 15, described below. The command processor then may finish processing the command at end block 1322.

Returning to step 1306, if the command is not t, a check is made at step 1308 whether the command is u. If not, the command is unknown, and the command processor may terminate at end block 1322 without processing the command. If the command is u, a command processor may effectively execute the combination of the processing performed for both command p and command t. Processing thus branches to both step 1310 and step 1320. This processing may be performed either in parallel, such as by spawning a new process or a new thread, or sequentially, by first executing the branch starting at step 1310, and next executing the branch starting a step 1320, for example. In either case, when processing is done in both branches, the process may finish at end block 1322.

The temperature monitoring server 106 may employ a variety of methods of monitoring temperature sensor data from registered devices. As has been discussed above, it may perform absolute temperature monitoring, in which it will check to see that a temperature reading is within an acceptable range, which may be configured by a device user during the registration of the device, in which the range is bounded on one end by a minimal temperature value, and on the other end by a maximum temperature value.

Instead of or in addition to absolute temperature monitoring, in some embodiments of the invention, the temperature monitoring server 106 may also monitor the rate of temperature change, and may trigger alerts if the rate of temperature change has accelerated faster than a normal rate of change calculated by the temperature monitoring server 106. The temperature monitoring server may calculate normal rate of change by observing temperature readings from the device and calculating a moving average rate over different time periods. In addition to sending alerts if the rate of temperature change is abnormal, the temperature monitoring server 106 may also be configured to respond to the remote device with a shorter reporting interval upon detecting an abnormal rate of change.

In some embodiments, the temperature monitoring server 106 may support at least two different types of rate of change monitoring: manual and self-learning. With manual rate of change monitoring, a user specifies a time period as well as the maximum number of degrees of change per the specified time period. With self-learning rate of change monitoring, the system may adaptively calculate an acceptable normal rate of change.

Besides absolute temperature monitoring and temperature rate of change monitoring, the system may also perform cycle monitoring. For example, air temperature maintained by an HVAC system has a pattern based on the cycle time of the HVAC system and on the rate of temperature change to the environment external to the one monitored. In some embodiments, the temperature monitoring server 106 may be configured to learn the cyclic patterns of temperature changes at a monitored location. If this temperature pattern deviates from the norm, the temperature monitoring server 106 may trigger an alert.

In some embodiments of the invention which include one or more of the monitoring methods described above, the temperature monitoring server 106 may implement these various monitoring methods as a number of plug-ins to the system. Software implemented plug-ins are know in the art and known techniques for implementing functions within plug-ins may be used to implement and integrate monitoring methods into temperature monitoring server 106. The architecture of this embodiment allows the temperature monitoring server 106 to be easily extended to support other additional monitoring methods in the future, and also facilitates the enabling or disabling of each monitoring method through a user interface provided to users of the devices. Such an architecture allows the function of temperature monitoring server 106 to be altered without altering the remote devices.

Figure 14:
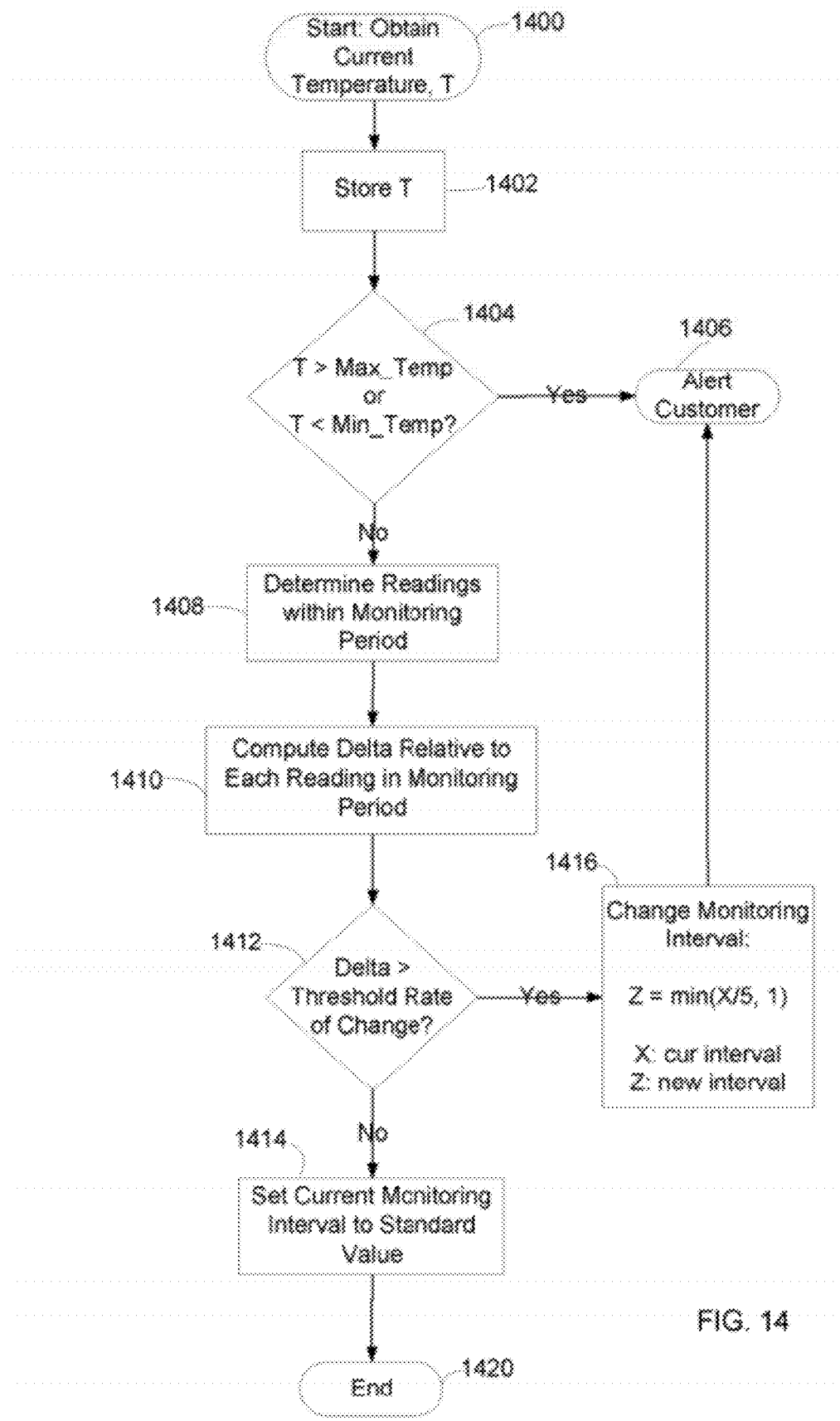
FIG. 14 is a flowchart for processing temperature reports according to some embodiments of the invention.
Figure 15:
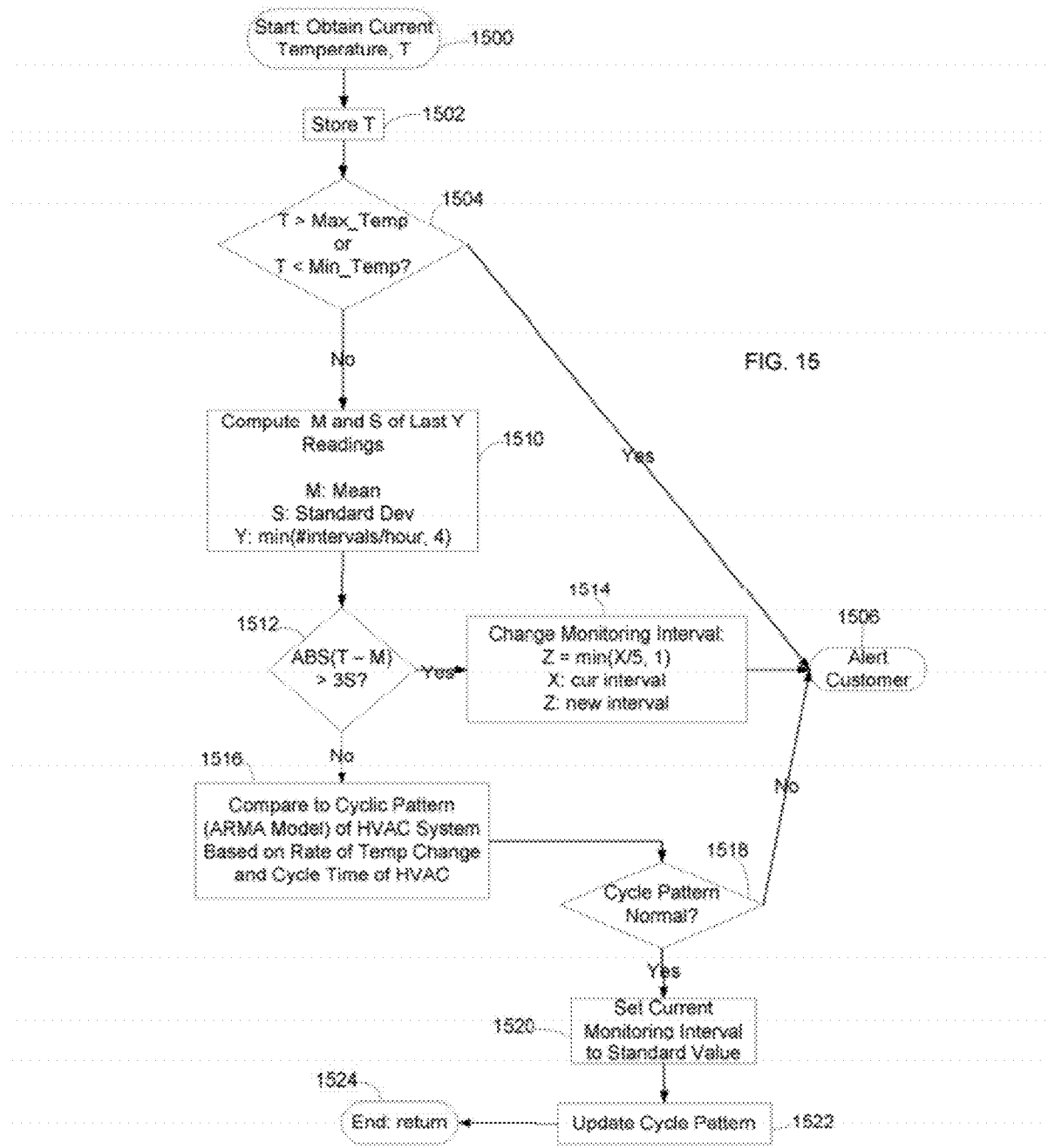
FIG. 15 is a flowchart of a method of processing temperature readings according to some embodiments of the invention.

FIGS. 14 and 15 illustrate two different embodiments of a variety of methods for monitoring and analyzing temperature sensor data. Each of FIGS. 14 and 15 could be an implementation of block 1320 in FIG. 13. FIG. 14 illustrates a flow chart for an implementation of a combination of absolute temperature monitoring and manual rate of change temperature monitoring. It is to be appreciated that the functionality illustrated in this flowchart may be implemented in a variety of ways, including via a number of software plug-ins to the temperature monitoring server 106, as described above.

The process begins at step 1400 when a command processor has obtained the current temperature reading, T, for a remote location for which the device has been registered. In step 1402, the command processor stores T into a computer storage medium associated with the remote device providing the temperature reading. While any computer storage medium may be used, in an embodiment of the invention, T is stored in database 108. In step 1404, T is compared against the maximum acceptable temperature and the minimum acceptable temperature registered for the device. If T is not within the acceptable range, the command processor may alert the customer in step 1406. Any of a variety of alert mechanisms may be used, including an email message, an SMS message, and a telephone call.

If T is within the acceptable range, the flow moves onto perform monitoring of the rate of temperature change based on manually input rate limits. At step 1408, the processor determines the set of temperature readings that are within the current monitoring period for the rate of temperature change. The monitoring period may include a number of temperature readings, and therefore, may encompass a number of monitoring intervals. In step 1410, the processor computes a delta relative to each reading in the monitoring period. In step 1412, the processor may check to see if the computed delta exceeds a threshold rate of change. The threshold rate of change may have been specified by the user during registration of the device. If the computed delta does not exceed the threshold, at step 1414, the processor sets the current monitoring interval to its standard, default value. On the other hand, if, at step 1412, the command processor determines that the computed delta exceeds the threshold rate of temperature change, the processor recalculates the monitoring interval. The new monitoring interval may be decreased, allowing for more frequent reporting. In one embodiment, the new reporting interval is the result of dividing the current monitoring interval by 5, and in which the minimum value of the new reporting interval is 1. The processor then alerts the customer in step 1406, using any of the alerting mechanisms discussed above.

FIG. 15 illustrates another embodiment of a variety of methods for monitoring and analyzing temperature sensor data. FIG. 15 could provide more details for block 1320 in FIG. 13. FIG. 15 illustrates a flow chart for an implementation of a combination of absolute temperature monitoring, self-learning rate of change temperature monitoring, and cycle monitoring. As was discussed in conjunction with FIG. 14 above, it is to be appreciated that the functionality illustrated in this flowchart may be implemented in a variety of ways, including via a number of software plug-ins to the temperature monitoring server 106, as described above.

At step 1500, a command processor has obtained the current temperature reading, T. The command processor, in step 1502, stores T on a computer storage medium. While any computer storage medium may be used, in an embodiment of the invention, the command processor stores T in database 108. As discussed in conjunction with FIG. 14, the processor then checks in step 1504 to make sure T is within an acceptable range, being no warmer than a maximum temperature, and no cooler than a minimum temperature. If T falls outside the acceptable range, the processor alerts the customer in step 1506, using any of a number of communication methods, including email and SMS messages, and telephone calls.

If T does not fall outside the acceptable range, the processor proceeds to the self-learning rate of change monitoring. In step 1510, the processor may calculate the mean and the standard deviation of the last Y temperature readings, where Y may be calculated as the number of reporting intervals per hour, with a minimum value of four. The value of Y may be input by a user, such as during a registration process, or obtained in any other suitable way. In step 1512, the processor may check to see if the absolute value of the difference between the current temperature reading T and the mean is greater than a multiple of the standard deviation. In the illustrated embodiment, the multiple is three. If the absolute value of the difference between T and the mean is greater than three times the standard deviation, the processor may calculate a new monitoring interval in step 1514. While a variety of calculations could be employed, in the illustrated embodiment, the new monitoring interval is set to the result of dividing the current monitoring interval by five, and in which the minimum value of the new monitoring interval is one. The processor then alerts the customer in step 1506, as discussed above.

Otherwise, the processor proceeds to the cycle-monitoring. In step 1516, the processor may compare the current data to a cyclic pattern corresponding to an ARMA model of the HVAC system based on the rate of temperature change and the cycle time of the HVAC system. Though, any suitable mechanism for representing cyclic variations may be employed. In step 1518, the processor may check to see if the cycle pattern is normal. Any suitable mechanism may be used for comparing a measured temperature pattern to a model representing a normal temperature pattern. For example, the frequency of cycles between maximum and minimum values may be compared. Alternatively or additionally, the amplitude between maximum and minimum temperature values may be compared. Though, any suitable comparison mechanism may be used. Regardless of how the comparison is made, if the comparison indicates that the measured temperature pattern is not normal, the processor alerts the customer in step 1506, as discussed above. Otherwise, in step 1520, the processor sets the current monitoring interval to the standard value, and updates the cycle pattern in step 1522 based on the latest temperature data. This last step may involve storing the updated cycle pattern on computer storage media. In one embodiment of the invention, the processor stores the updated cycle pattern in database 108. The flow proceeds to end block 1524, indicating that the processor has finished analyzing the latest temperature reading.

Having thus described several aspects of at least one embodiment of this invention, it is to be appreciated that various alterations, modifications, and improvements will readily occur to those skilled in the art.

For example, the invention was illustrated using a temperature monitoring system as an example. Techniques described herein may be employed in systems that monitor environmental parameters instead of or in addition to temperature.

Also, it is described that a sensor and transceiver are packaged together as a remote unit. While such packaging may provide a simple mechanism to deploy temperature monitoring, it is not required. In some embodiments, a transceiver and controller may be packaged with an interface to a sensor. The remote unit may then be assembled by connecting a sensor to the transceiver.

Such alterations, modifications, and improvements are intended to be part of this disclosure, and are intended to be within the spirit and scope of the invention. Accordingly, the foregoing description and drawings are by way of example only.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including as a local area network or a wide area network, such as an enterprise network or the Internet. Such networks may be based on any suitable technology and may operate according to any suitable protocol and may include wireless networks, wired networks or fiber optic networks.

Also, the various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, the invention may be embodied as a computer readable medium (or multiple computer readable media) (e.g., a computer memory, one or more floppy discs, compact discs, optical discs, magnetic tapes, flash memories, circuit configurations in Field Programmable Gate Arrays or other semiconductor devices, or other tangible computer storage medium) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above.

The terms "program" or "software" are used herein in a generic sense to refer to any type of computer code or set of computer-executable instructions that can be employed to program a computer or other processor to implement various aspects of the present invention as discussed above. Additionally, it should be appreciated that according to one aspect of this embodiment, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc.

that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that conveys relationship between the fields. However, any suitable mechanism may be used to establish a relationship between information in fields of a data structure, including through the use of pointers, tags or other mechanisms that establish relationship between data elements.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A method of remote monitoring of one or more environmental parameters using a plurality of remote units for a plurality of customers, each customer of the plurality of customers having at least one remote unit of the plurality of remote units, each remote unit comprising a sensor and a transceiver and being associated with an identifier, the method comprising:
   receiving, for each customer of the plurality of customers, registration information for a remote unit to be registered, wherein receiving the registration information for the remote unit to be registered comprises receiving:
     one or more alarm conditions relating to sensor output of the sensor of the remote unit to be registered, and
     an indication of one or more alert actions to be taken when one or more of the one or more alarm conditions is met;
   for each registered remote unit of the plurality of remote units, following receipt of registration information for the registered remote unit, establishing one or more scheduled reporting times for the registered remote unit;
   receiving a report from a registered remote unit of the plurality of remote units, the report comprising an indication of an output of the sensor of the registered remote unit; and
   in response to determining that the report was received without error,
     acknowledging the report by transmitting at least one message to the registered remote unit, the at least one message comprising at least one value set based on an evaluation of the output of the sensor;
     in response to determining, based at least in part on the indication of the output in the report, that the output of the sensor satisfies one or more of the one or more alarm conditions, initiating an alert action of the one or more alert actions indicated by the registration information for the registered remote unit.

2. The method of claim 1, wherein receiving the registration information for the remote unit to be registered comprises receiving the identifier for the remote unit to be registered.

3. The method of claim 1, further comprising:
   assigning an identifier to a remote unit; and
   distributing the remote unit with indicia of the identifier,
   wherein receiving the registration information for the remote unit to be registered comprises receiving the indicia of the identifier and/or the identifier.

4. The method of claim 1, wherein receiving the registration information for the remote unit to be registered comprises receiving the registration information from a customer.

5. The method of claim 1, wherein the one or more alarm conditions relating to the sensor output comprise at least one alarm condition relating to a limit on an acceptable value of the sensor output.

6. The method of remote monitoring of claim 1, further comprising:
   when no report is received from a registered remote unit of the plurality of remote units at a scheduled reporting time for the registered remote unit, initiating an alert action in accordance with at least one of the one or more alert actions indicated by the registration information for the registered remote unit.

7. The method of remote monitoring of claim 1, wherein receiving the report from the registered remote unit comprises receiving the report via a cellular network.

8. The method of remote monitoring of claim 1, wherein the indication of the one or more alert actions comprises an indication of one or more of sending an e-mail, sending an SMS message, placing a phone call, or sending an instant message.

9. The method of remote monitoring of claim 1, wherein the at least one value comprises an indication of a next scheduled reporting time for the registered remote unit.

10. A method of remote monitoring of one or more environmental parameters using a plurality of remote units for a plurality of customers, each customer of the plurality of customers having at least one remote unit of the plurality of remote units, each remote unit comprising a sensor and a transceiver and being associated with an identifier, the method comprising:
   receiving, for each customer of the plurality of customers, registration information for a remote unit to be registered, wherein receiving the registration information for the remote unit to be registered comprises receiving:
     one or more alarm conditions relating to sensor output of the sensor of the remote unit to be registered, and an indication of one or more alert actions to be taken when one or more of the one or more alarm conditions is met;

for each registered remote unit of the plurality of remote units, following receipt of registration information for the registered remote unit, establishing one or more scheduled reporting times for the registered remote unit;

receiving a report from a registered remote unit of the plurality of remote units, the report comprising an indication of an output of the sensor of the registered remote unit;

in response to determining, based at least in part on the indication of the output in the report, that the output of the sensor satisfies one or more of the one or more alarm conditions, initiating an alert action of the one or more alert actions indicated by the registration information for the registered remote unit;

in response to receiving the report from the registered remote unit, sending an acknowledgment to the registered remote unit, the acknowledgement comprising an indication of a next scheduled reporting time for the registered remote unit; and determining the next scheduled reporting time for the registered remote unit based at least in part on a comparison of an output of the sensor to one or more of the one or more alarm conditions, wherein the determining comprises determining the next scheduled reporting time to be a first time when the output of the sensor satisfies or is within a threshold value of satisfying one or more of the one or more alarm conditions and a second time when the output of the sensor does not satisfy any of the one or more alarm conditions, the second time being later than the first time.

11. The method of remote monitoring of claim 10, wherein:
the one or more alarm conditions comprise a first alarm condition regarding an acceptable temperature range and a second alarm condition regarding an acceptable rate of change of temperature; and
the method further comprises:
determining that the first alarm condition and/or the second alarm condition is satisfied when the report from the registered remote unit indicates that a temperature is outside the acceptable temperature range and/or a rate of change of the temperature is outside the acceptable rate of change of temperature; and
determining that the first alarm condition and the second alarm condition are not satisfied when the report from the registered remote unit indicates that the temperature is inside the acceptable temperature range and the rate of change of the temperature is inside the acceptable rate of change of temperature.

12. A method of remote monitoring of one or more environmental parameters using a plurality of remote units for a plurality of customers, each customer of the plurality of customers having at least one remote unit of the plurality of remote units, each remote unit comprising a sensor and a transceiver and being associated with an identifier, the method comprising:
receiving, for each customer of the plurality of customers, registration information for a remote unit to be registered, wherein receiving the registration information for the remote unit to be registered comprises receiving:
one or more alarm conditions relating to sensor output of the sensor of the remote unit to be registered, and
an indication of one or more alert actions to be taken when one or more of the one or more alarm conditions is met;

for each registered remote unit of the plurality of remote units, following receipt of registration information for the registered remote unit, establishing one or more scheduled reporting times for the registered remote unit;

receiving a report from a registered remote unit of the plurality of remote units, the report comprising an indication of an output of the sensor of the registered remote unit;

in response to determining, based at least in part on the indication of the output in the report, that the output of the sensor satisfies one or more of the one or more alarm conditions, initiating an alert action of the one or more alert actions indicated by the registration information for the registered remote unit;

in response to receiving the report from the registered remote unit, sending an acknowledgment to the registered remote unit, the acknowledgement comprising an indication of a next scheduled reporting time for the registered remote unit; and establishing the next scheduled reporting time for a remote unit in response to receiving the report, wherein establishing the next scheduled reporting time comprises:
when the output of the sensor does not satisfy one or more of the one or more alarm conditions, computing the new scheduled reporting time as a current scheduled reporting time plus a reporting interval; and
when the output of the sensor satisfies or is within a threshold value of satisfying any of the one or more alarm conditions, computing the new scheduled reporting time as the current scheduled reporting time plus a fraction of the reporting interval.

13. The method of remote monitoring of claim 12, wherein receiving the registration information comprises receiving the reporting interval.

14. At least one computer-readable storage medium having encoded thereon executable instructions that, when executed by at least one computer, cause the computer to carry out a method of remote monitoring of environmental conditions using at least one remote unit, each remote unit comprising a sensor and a transceiver and being associated with an identifier, the method comprising:
receiving registration information for a remote unit, the registration information for the remote unit comprising:
one or more alarm conditions relating to sensor output of the sensor of the remote unit, and
an indication of one or more alert actions to be taken when one or more of the one or more alarm conditions is met;
establishing one or more scheduled reporting times for the remote unit;
receiving a report from the remote unit, the report comprising an indication of an output of the sensor of the remote unit;
determining whether the report as received includes one or more errors;
responding to the report by transmitting at least one message to the remote unit, wherein transmitting the at least one message comprises:
in response to determining that the report as received includes one or more errors, transmitting, as the at least one message, a negative acknowledgement, and
in response to determining that the report as received does not include one or more errors, transmitting, as the at least one message, at least one message comprising at least one value set based on an evaluation of the output of the sensor; and in response to determining, based at least in part on the indication of the output in the report, that the output of the sensor satisfies one or more of the one or more alarm conditions, initiating an alert action of the one or more alert actions indicated by the registration information for the remote unit.

15. The at least one computer-readable storage medium of claim 14, wherein the method further comprises:
storing registration information for a plurality of remote units for a plurality of customers.

16. The at least one computer-readable storage medium of claim 14, wherein receiving the registration information comprises receiving the registration information from a customer.

17. An apparatus comprising:
at least one processor; and
at least one computer-readable storage medium having encoded thereon executable instructions that, when executed by the at least one processor, cause the at least one processor to carry out a method of remote monitoring of environmental conditions using at least one remote unit, each remote unit comprising a sensor and a transceiver and being associated with an identifier, the method comprising:
receiving registration information for a remote unit, the registration information for the remote unit comprising:
one or more alarm conditions relating to sensor output of the sensor of the remote unit, and
an indication of one or more alert actions to be taken when one or more of the one or more alarm conditions is met;
receiving a report from the remote unit, the report comprising an indication of an output of the sensor of the remote unit and an error detection code;
in response to determining, based at least in part on the indication of the output in the report, that the output of the sensor satisfies one or more of the one or more alarm conditions, initiating an alert action of the one or more alert actions indicated by the registration information for the remote unit;
checking the report for errors using the error detection code;
when it is determined, as a result of the checking, that the report does not contain errors:
determining a value at least in part by processing the indication of the output of the sensor, and
responding to the report by transmitting a message comprising the value; and
when it is determined, as a result of the checking, that the report contains one or more errors, responding to the report by transmitting a negative acknowledgement.

18. The apparatus of claim 17, wherein:
receiving the report comprises receiving:
the identifier for the remote unit;
at least one command identifier;
for each command identifier of the at least one command identifier, a payload associated with a command identified by the command identifier; and
the error detection code, wherein the error detection code is a Cyclic Redundancy Check (CRC) code.

19. An environmental monitoring system comprising:
the apparatus of claim 17; and
a remote unit comprising:
at least one second processor; and
at least one second computer-readable storage medium having encoded thereon executable instructions that, when executed by the at least one second processor, cause the at least one second processor to carry out a method comprising:
transmitting the report;
receiving a response to the report;
determining whether the report was received without error, wherein the determining comprises determining whether the response is the message comprising the value determined at least in part by processing the indication of the output of the sensor or whether the response is the negative acknowledgement;
in response to determining that the response is the message comprising the value, taking at least one action based on the value; and
in response to determining that the response is the negative acknowledgement, retransmitting the report.

20. The apparatus of claim 17, wherein the method further comprises:
storing registration information for a plurality of remote units for a plurality of customers.

21. A method of remote monitoring of one or more environmental parameters using a plurality of remote units for a plurality of customers, each customer of the plurality of customers having at least one remote unit of the plurality of remote units, each remote unit comprising a sensor and a transceiver, the method comprising:
for each remote unit of the plurality of remote units, establishing one or more scheduled reporting times for the registered remote unit;
in response to receiving, from a remote unit of the plurality of remote units, a report at a scheduled reporting time established for the remote unit, the report comprising an indication of an output of the sensor of the registered remote unit,
determining a next scheduled reporting time for the remote unit based at least in part on a comparison of an output of the sensor to one or more alarm conditions, wherein the determining comprises determining the next scheduled reporting time to be a first time when the output of the sensor satisfies or is within a threshold value of satisfying one or more of the one or more alarm conditions and a second time when the output of the sensor does not satisfy any of the one or more alarm conditions, the second time being later than the first time; and
acknowledging receipt of the report at least in part by sending to the remote unit an indication of the next scheduled reporting time for the remote unit.

22. The method of claim 21, wherein acknowledging receipt of the report at least in part by sending the indication of the next scheduled reporting time for the remote unit comprises acknowledging proper receipt of the report at least in part by sending the indication of the next scheduled reporting time to the remote unit.

23. The method of claim 21, wherein:
receiving the report comprises receiving at least one first message according to a best effort communication protocol; and
acknowledging receipt of the report by sending the indication of the next scheduled reporting time comprises sending at least one second message according to the best effort communication protocol.

24. The method of claim 23, wherein the best effort communication protocol is the User Datagram Protocol (UDP).

25. The method of claim 1, further comprising:
in response to determining that the report was received with errors, responding to the report by transmitting a negative acknowledgement to the registered remote unit.

26. The method of claim 1, wherein:
receiving the report comprises receiving the report according to a best effort communication protocol; and
acknowledging the report by transmitting the at least one message comprises transmitting the at least one message according to the best effort communication protocol without transmitting a separate acknowledgement.

27. The method of claim 1, wherein:
receiving the report comprises receiving the report according to a best effort communication protocol; and
acknowledging the report consists of transmitting the at least one message to the registered remote unit.

28. The apparatus of claim 17, wherein responding to the report, when it is determined that the report does not contain errors, by transmitting the message comprising the value comprises responding to the report without transmitting a separate acknowledgement message.

29. The apparatus of claim 17, wherein responding to the report, when it is determined that the report does not contain errors, by transmitting the message comprising the value comprises acknowledging receipt of the report by transmitting the message comprising the value.

* * * * *